(12) United States Patent
Mischitz et al.

(10) Patent No.: US 9,793,119 B2
(45) Date of Patent: Oct. 17, 2017

(54) METHOD FOR STRUCTURING A SUBSTRATE USING A PROTECTION LAYER AS A MASK

(71) Applicant: Infineon Technologies AG, Neubiberg (DE)

(72) Inventors: Martin Mischitz, Wernberg (AT); Markus Heinrici, Villach (AT); Florian Bernsteiner, Kirschlag (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/347,835

(22) Filed: Nov. 10, 2016

(65) Prior Publication Data

US 2017/0154767 A1 Jun. 1, 2017

Related U.S. Application Data

(62) Division of application No. 14/953,492, filed on Nov. 30, 2015, now abandoned.

(51) Int. Cl.
*H01L 21/00* (2006.01)
*H01L 21/027* (2006.01)
*H01L 21/308* (2006.01)
*H01L 21/306* (2006.01)
*H01L 21/3065* (2006.01)
*H01L 21/02* (2006.01)

(52) U.S. Cl.
CPC .... *H01L 21/0274* (2013.01); *H01L 21/02203* (2013.01); *H01L 21/3065* (2013.01); *H01L 21/3085* (2013.01); *H01L 21/3086* (2013.01); *H01L 21/30604* (2013.01)

(58) Field of Classification Search
CPC ................................................. H01L 21/02203
See application file for complete search history.

(56) References Cited

U.S. PATENT DOCUMENTS

| | | | | |
|---|---|---|---|---|
| 8,569,109 B2* | 10/2013 | Mengel | ................. | H01L 24/743 257/782 |
| 9,362,127 B2* | 6/2016 | Krenzer | ............ | H01L 21/02068 |
| 2016/0225718 A1* | 8/2016 | Mischitz | ........... | H01L 23/53228 |

* cited by examiner

*Primary Examiner* — Ngan Ngo
(74) *Attorney, Agent, or Firm* — Viering, Jentschura & Partner mbB

(57) ABSTRACT

According to various embodiments, a method of processing a substrate may include: disposing a viscous material over a substrate including at least one topography feature extending into the substrate to form a protection layer over the substrate; adjusting a viscosity of the viscous material during a contacting period of the viscous material and the substrate to stabilize a spatial distribution of the viscous material as disposed; processing the substrate using the protection layer as mask; and removing the protection layer after processing the substrate.

17 Claims, 24 Drawing Sheets

300a

300b

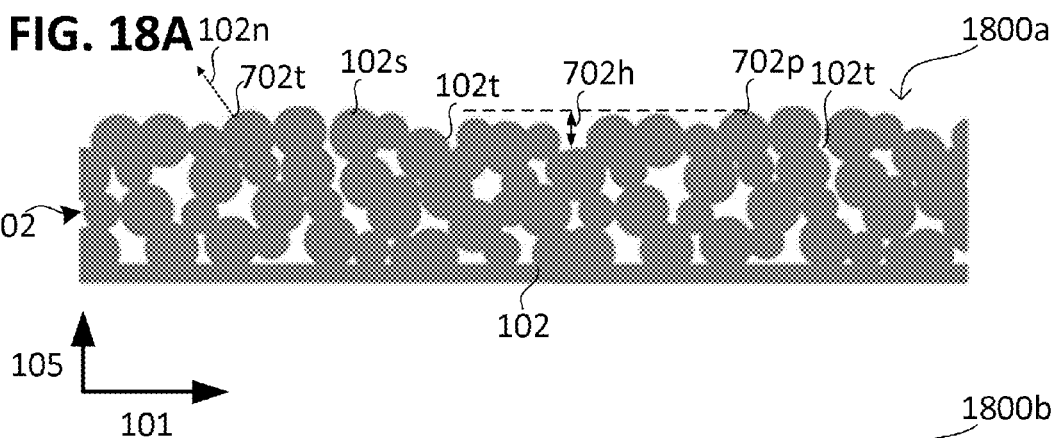
FIG. 18A
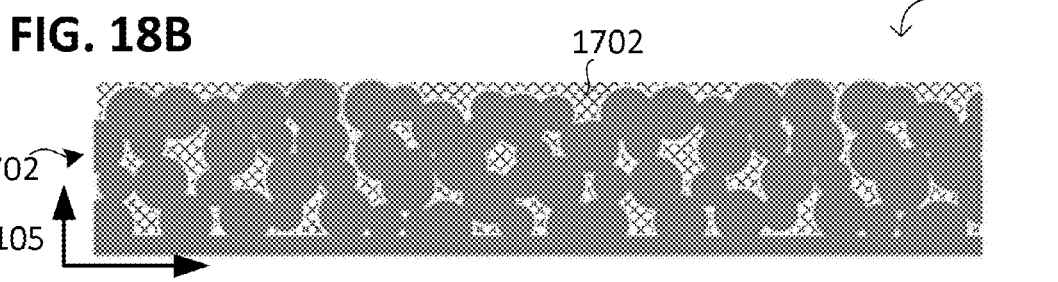
FIG. 18B
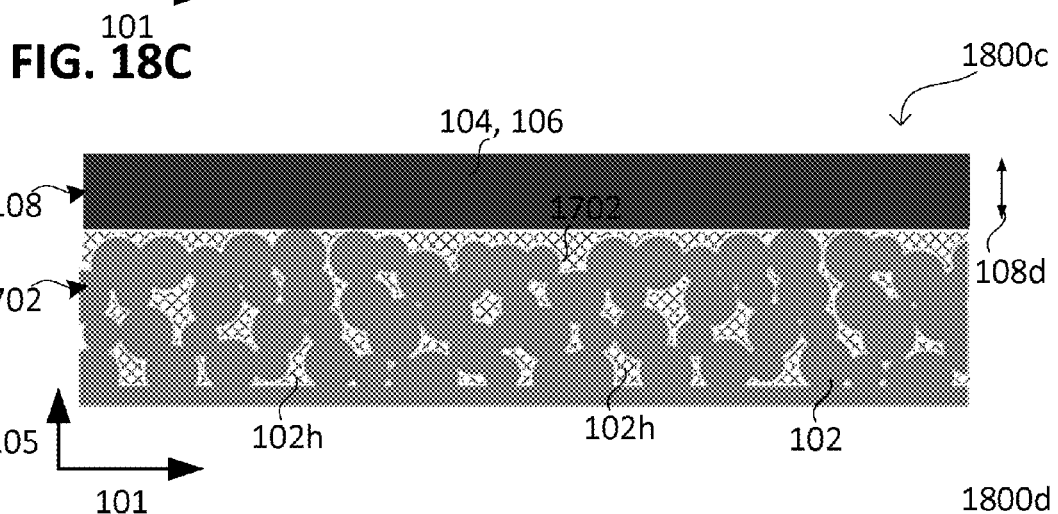
FIG. 18C
FIG. 18D
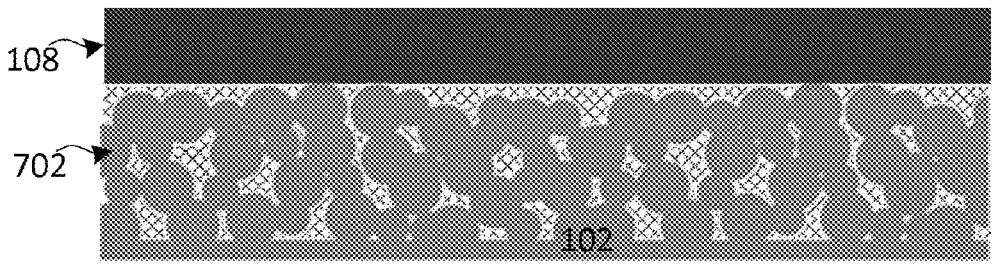

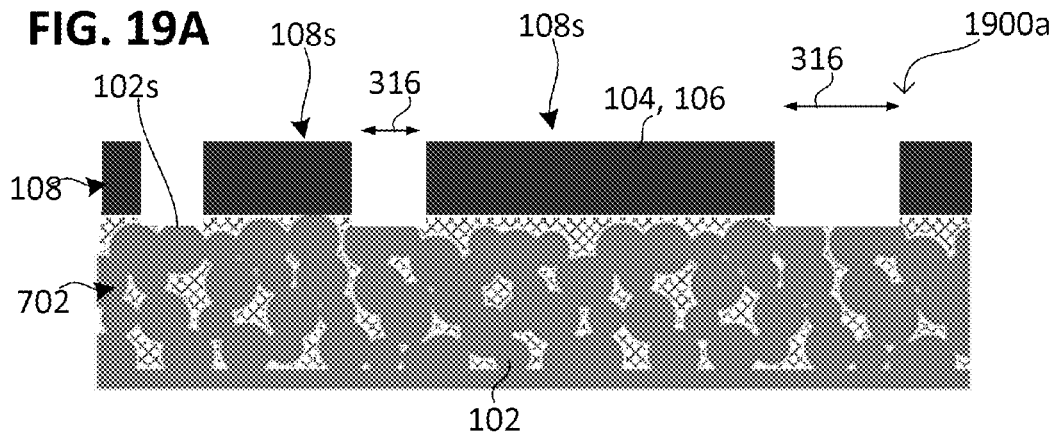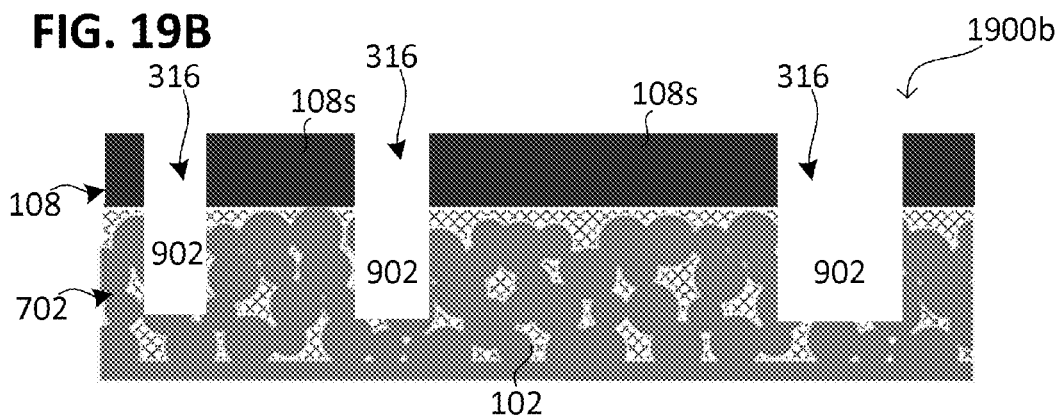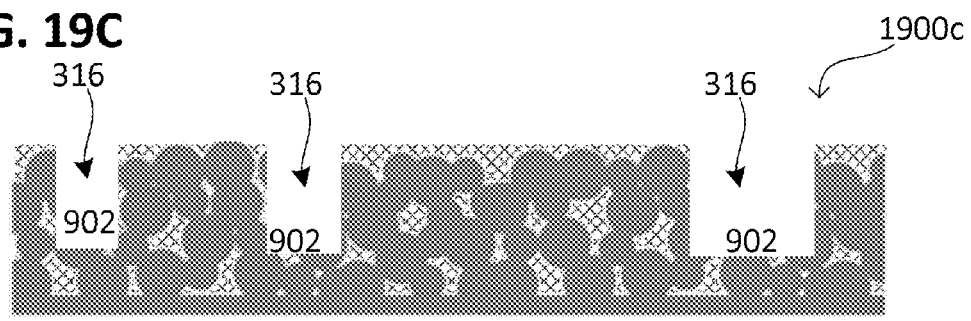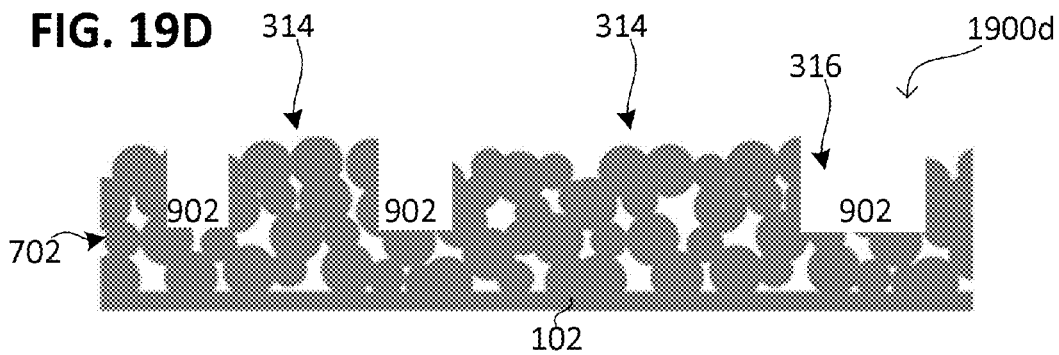

METHOD FOR STRUCTURING A SUBSTRATE USING A PROTECTION LAYER AS A MASK

RELATED APPLICATION(S)

This application is a divisional of U.S. patent application Ser. No. 14/953,492, filed on Nov. 30, 2015, entitled "A METHOD FOR STRUCTURING A SUBSTRATE", which is incorporated herein by reference.

TECHNICAL FIELD

Various embodiments relate generally to a method for structuring a substrate.

BACKGROUND

In general, semiconductor materials may be processed in semiconductor technology on or in a substrate (also referred to as a wafer or a carrier), e.g. to fabricate integrated circuits (also referred to as chips). During processing the semiconductor material, certain process steps may be applied, such as forming one or more layers over the substrate, structuring the one or more layers, or contacting the chips. In general, a porous copper layer offers beneficial mechanical properties, for example, in the field of a thick power metallization.

However, a conventional etching mask is limited in its applicability for porous copper layers 100a or also other rough layers 100a, as illustrated in FIG. 1A to FIG. 2C. For structuring, a conventional etching mask is formed 100b from a liquid 12p (e.g. a low viscous photoresist) by spin coating and subsequently patterned 100d by photolithography 100c using exposure to light 110. By applying this procedure to the porous copper layer 100a, the liquid 12p is seeping 108 deep into the porous layer 100a, which complicates processing of the porous copper layer 100a. On the one hand, the deep seeded in liquid 12p is shaded from being exposed to light 110, which, in case of a positive photoresist 116, leads to masking errors and impairs a precise etching of the porous copper layer 100a. On the other hand, the liquid 12p is not fully covering the uneven topography of the porous copper layer 100a. After pattering 100d the etching mask, beside regions 112 in which the porous copper layer 100a is designated to be removed by chemical wet etching 200a, also the protrusions 14p of the porous layer 100a may remain uncovered. During chemical wet etching 200a, the etchant also contacts regions, in which the porous layer is designated to remain undamaged, and etches holes 114 in there (also referred to as pitting). After chemical wet etching 200a, the deep seeded liquid 12p may withstand from being removed out of the porous layer 100a leading to residual photoresist 118.

Therefore, a conventional etching mask lacks in its capability of precise processing and protecting the porous copper layer 100a leading to pitting, as illustrated in FIG. 2C for the usage of a 4.4 micrometer (μm) thick etching mask.

Conventionally, the deposition of the porous layer 100a may lead to a wafer level non-uniformity in the topography of the porous layer 100a. For example, forming the porous copper layer 100a using stencil printing may result in topography differences up to 5 μm between the wafer center and the wafer rim. For example, forming the porous copper 100a layer using plasma-dust may result in a plurality of grooves, which are several micrometers deep. Such topography non-uniformity may accumulate the low viscous photoresist resulting in uncovered regions of the wafer similar to 200a. FIG. 3A illustrates a wafer after preparing a photoresist mask from a liquid by spin coating 300a and photolithography, and FIG. 3B the wafer after etching 300b the wafer. As visible from FIG. 3B, the photoresist mask is removed from the peripheral region during etching since the wafer was substantially uncovered in the peripheral region.

Alternative to a liquid-processed mask, a foil resist may be conventionally used for masking an uneven or porous surface. The foil resist includes a thick foil and an adhesive, which may be structured by photolithography. This approach is cost intensive and effortful.

Alternatively to masking, a porous contact pad may be printed directly according to its designated pattern. This may result in a low pattern accuracy and flat edges of the contact pad.

SUMMARY

According to various embodiments, a method of processing a substrate may include: disposing a viscous material over a substrate including at least one topography feature extending into the substrate to form a protection layer over the substrate; adjusting a viscosity of the viscous material during a contacting period of the viscous material and the substrate to stabilize a spatial distribution of the viscous material as disposed; processing the substrate using the protection layer as mask; and removing the protection layer after processing the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 18A to FIG. 18D respectively show a method according to various embodiments in a schematically side view or schematically cross sectional view;

FIG. 19A to FIG. 19D respectively show a method according to various embodiments in a schematically side view or schematically cross sectional view;

DESCRIPTION

Figure 1A:
FIGS. 1A to 1D respectively show a conventional method.
Figure 1B:
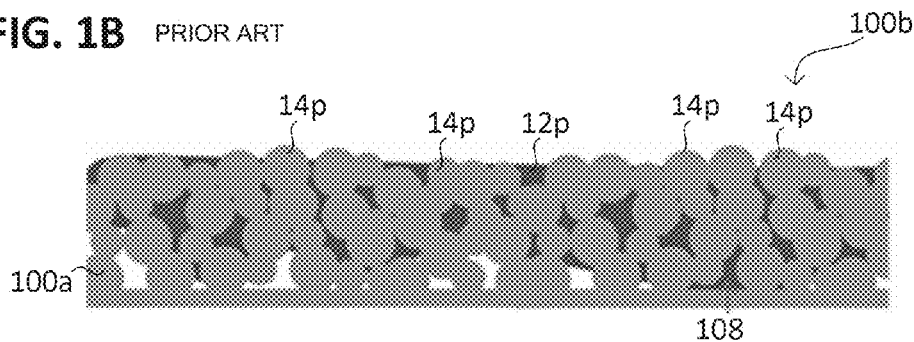
Figure 1C:
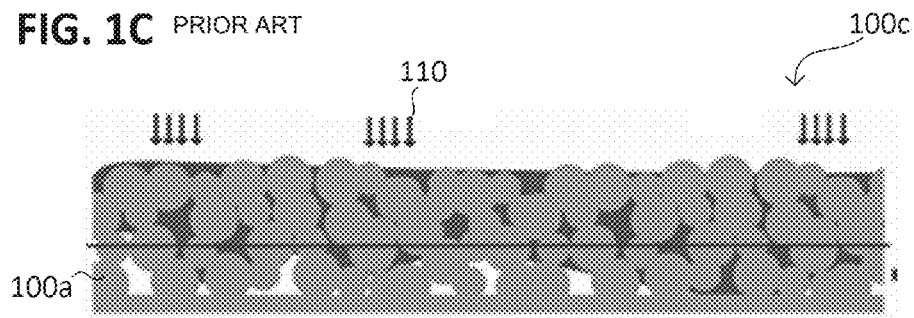
Figure 1D:
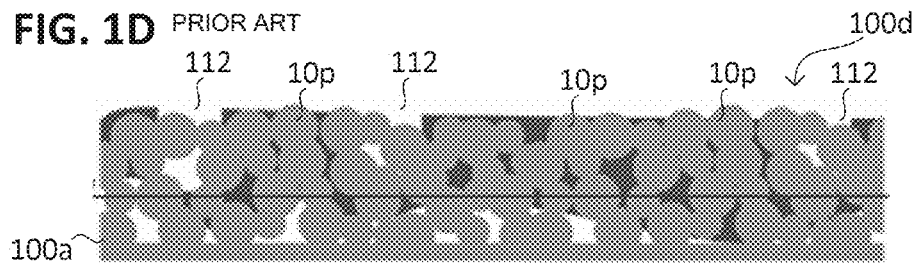
Figure 2A:
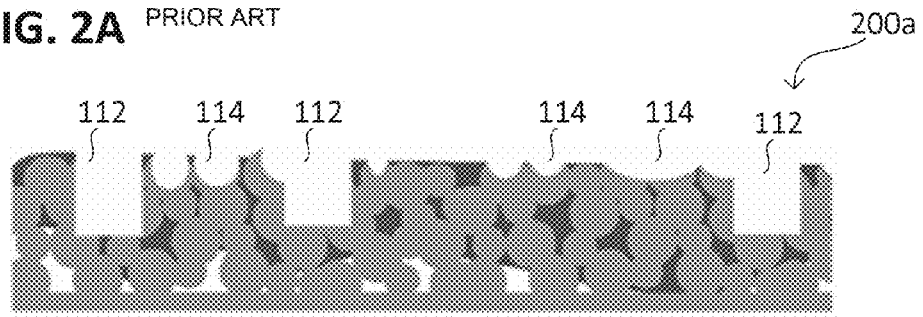
FIGS. 2A to 2C respectively show a conventional method.
Figure 2B:
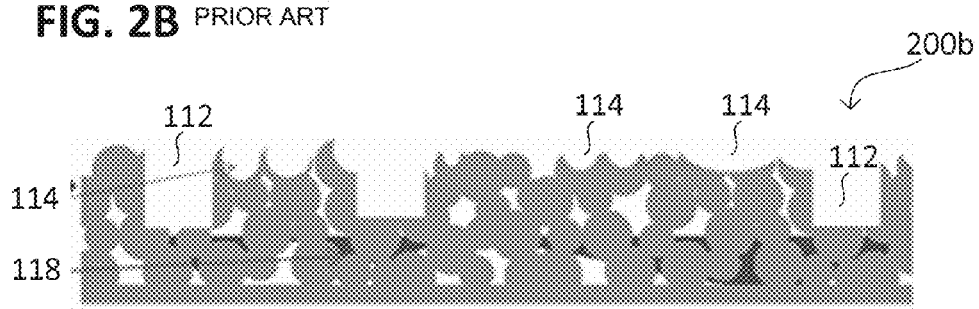
Figure 2C:
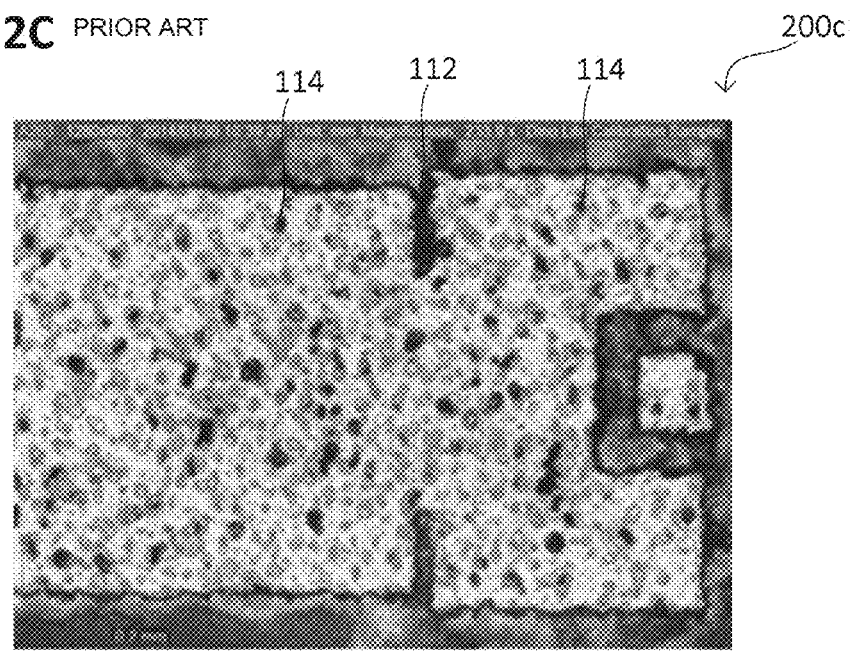
Figure 3A:
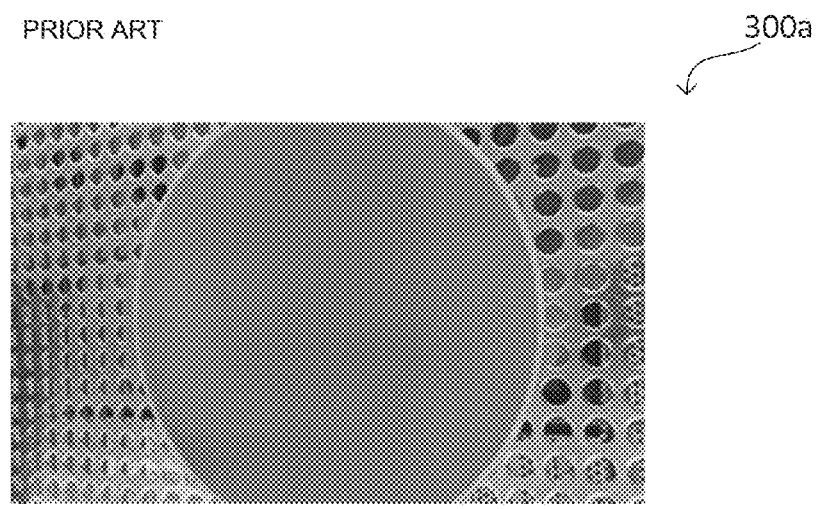
FIGS. 3A and 3B respectively show a conventional method.
Figure 3B:
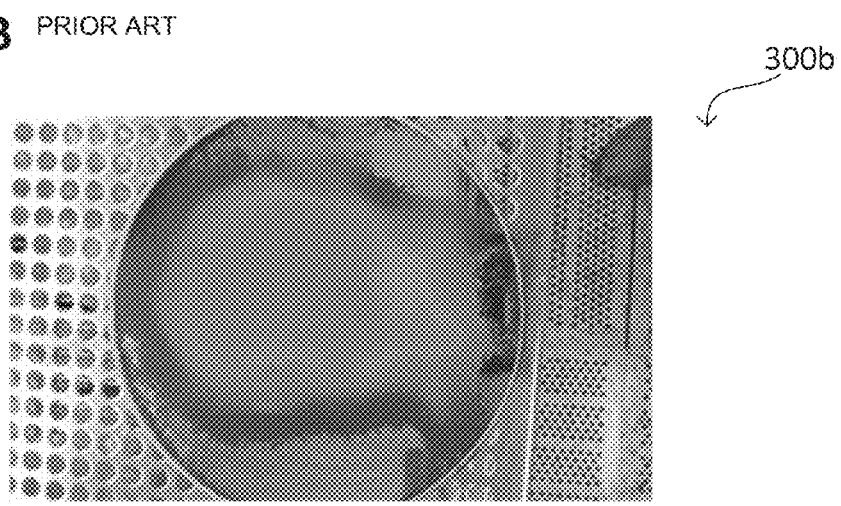

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, a semiconductor region may include or be formed from semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the semiconductor region is made of silicon (doped or undoped), in an alternative embodiment, the semiconductor region is a silicon on insulator (SOI) wafer. As an alternative, any other suitable semiconductor material can be used for the semiconductor region, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, the semiconductor region may be processed to form one or more semiconductor chips at least one of in or over the semiconductor region. A semiconductor chip may include an active chip area. The active chip area may be disposed in a portion of the semiconductor region and may include one or more semiconductor circuit elements like a transistor, a resistor, a capacitor, a diode or the like. The one or more semiconductor circuit elements may be configured to perform computing or storage operations. Alternatively or additionally, the one or more semiconductor circuit elements may be configured to perform switching or rectifying operations, e.g. in power electronics.

According to various embodiments, a semiconductor chip may be singulated from the semiconductor region by removing material from a kerf region of the semiconductor region (also called dicing or cutting the semiconductor region). For example, removing material from the kerf region of the semiconductor region may be processed by scribing and breaking, cleavage, blade dicing or mechanical sawing (e.g. using a dicing saw). After singulating the semiconductor chip, it may be electrically contacted and encapsulated, e.g. by mold materials, into a chip carrier (also called a chip housing) which may then be suitable for use in electronic devices. For example, the semiconductor chip may be bonded to a chip carrier by wires, and the chip carrier may be soldered onto a printed circuit board.

According to various embodiments, the substrate may include or be formed from a semiconductor region. Alternatively or additionally, the semiconductor region may be at least partially covered by a layer.

According to various embodiments, a structured hot-melt material may be used for forming a mask (also referred to as hot-melt mask) over a porous structure of a substrate, e.g. including at least one of a porous layer (e.g. a porous metal layer) or a porous semiconductor region. The mask may be used for further processing the porous structure, e.g. by etching, e.g. by wet etching. Due to the properties of the hot-melt material, seeping of the hot-melt material into the porous structure of the substrate may be reduced or prevented which facilitates subsequent removal of the mask including or formed from the hot-melt material.

Alternatively or additionally, a sacrificial material (e.g. a water-soluble material) may be disposed over a porous structure of a substrate, e.g. including at least one of a porous layer (e.g. a porous metal layer) or a porous semiconductor region. For example, the sacrificial material may include or be formed from a water-soluble material, e.g. HogoMax. The sacrificial material may at least partially fill (in other words, partially fill or completely fill) the porous structure, such that a viscous resist may be prevented from seeping into the porous structure. Alternatively or additionally, other irregular surface features may at least be partially filled by the sacrificial material. Illustratively, the viscous resist may float of the sacrificial material. Using the sacrificial material, a roughness of the substrate may be reduced leading to a reduced pitting. The resist disposed over the sacrificial material may be structured, e.g. by photolithography, to form a mask from the resist.

According to various embodiments, a structured protection layer may be formed with or without lithographical structuring of the protection layer. The protection layer may be printed according to a predetermined pattern (illustratively, a masking pattern). The protection layer may be configured to protect the underlying structure, e.g. the porous structure, from being processed in further processing, e.g. etching. Illustratively, the protection layer may be used as a mask.

According to various embodiments, a protection layer may be provided which is not seeking deeply into the underlying structure, e.g. the porous structure. This may facilitate to remove the protection layer after further processing. For example, the protection layer may be removed by at least one of: a solvent, e.g. a heated solvent, an alkaline fluid, an organic fluid, or a water based fluid.

According to various embodiments, a protection layer may be provided facilitating at least one of the following with regard to conventional photoresist: reduced seeking into the structure; coverage of higher topography features (e.g. a higher roughness, steps, substrates having a low layer thickness uniformity); reducing costs (due to the usage of inexpensive materials and reduced material consumption); reducing processing effort (no lithography step necessary); increased structural preciseness (e.g. increasing an edge steepness of the structured substrate).

Optionally, the viscous material (e.g. including or formed from a hot-melt material) may include a chemically unsaturated material (e.g. a chemically unsaturated hot-melt material). The chemically unsaturated material (also referred to as photoactive material) may provide to form cross-linking of polymer chains (e.g. wax chains), e.g. by exposure to ultraviolet light. This may facilitate the increase a mechanical stability (illustratively, mechanical robustness). Optionally, this may allow structuring the protection layer by lithography, e.g. also if the protection layer is formed according to a predetermined pattern, e.g. by printing. Illustratively, the optional structuring by lithography may increase the structural accuracy of the protection layer.

According to various embodiments, the protection layer may be formed over a contact pad, e.g. a porous contact pad.

Figure 4A:
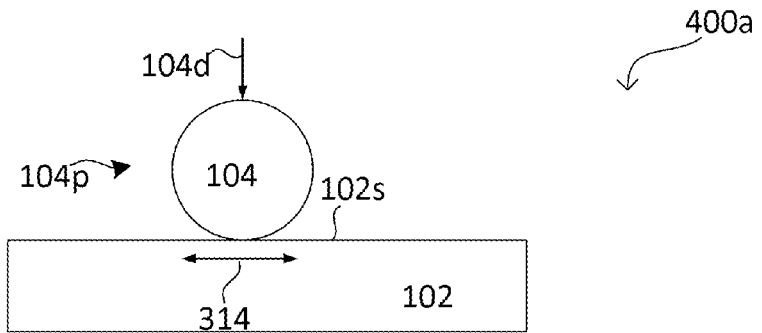
FIG. 4A to FIG. 4D respectively show a method according to various embodiments in a schematically side view or schematically cross sectional view.
Figure 4B:
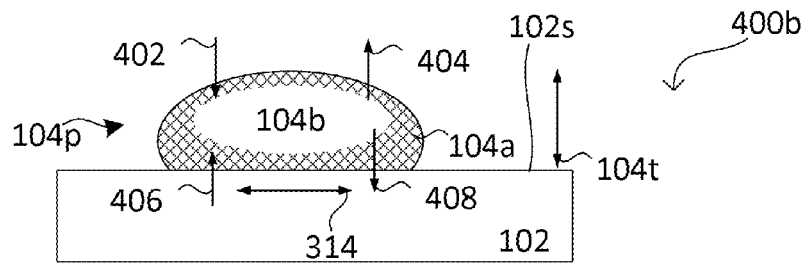
Figure 4C:
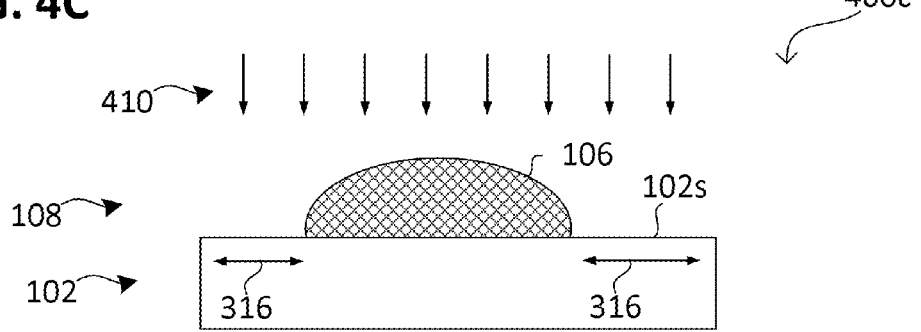
Figure 4D:
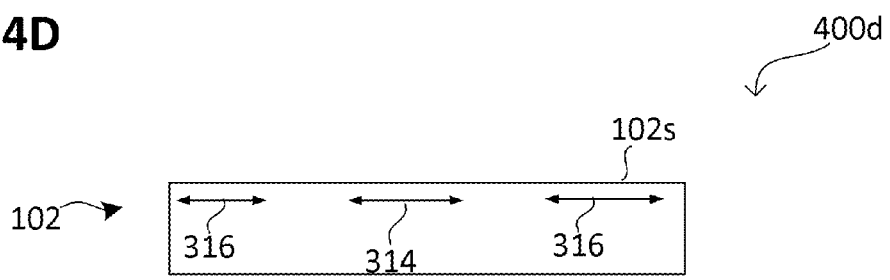

FIG. 4A, FIG. 4B and FIG. 4C respectively illustrate a method according to various embodiments in a schematically side view or schematically cross sectional view.

The method may include in 400a disposing 104d a viscous material 104 (in other words, a base material formed from a viscous state 104) over a substrate 102. The viscous material 104 may refer to as a viscous (e.g. a low viscous or highly viscous) state (also referred to as flowable state) of the base material. The viscous material 104 may include or be formed from at least one of: a solution (e.g. the dissolved base material), a glass transition state or a mold (the molten base material).

The base material (e.g. including or formed from the viscous state 104), e.g. a solution, may include or be formed from at least one of (in other words, from at least one material selected from the group of the following materials): a polymer, e.g., epoxy resin (e.g. SU-8), a solvent, e.g. or a photoactive component.

For example, the polymer may include or be formed from at least one of: Poly(methyl methacrylate) (PMMA), Phenol formaldehyde resin, Poly(methyl glutarimide) (PMGI). For example, the solvent may include or be formed from at least one of: cyclopentanone or γ-butyrolactone (GBL).

Alternatively or additionally, the base material (e.g. including or formed from the viscous state 104), e.g. the molten base material, may include or be formed from at least one of: a thermoset (also referred to as thermosetting polymer), a thermoplastic (also referred to as thermoplastic material or thermosoftening plastic), or an elastomer (e.g. also a thermoplastic elastomer, also referred to as thermoplastic rubber), a hot-melt material. For example, the base material (e.g. including or formed from the viscous state 104), e.g. the molten base material, may include or be formed from at least one of: polyamide (PA), polyethylene (PE), polyurethane, ethylene-acrylate copolymer, polyolefin (e.g. amorphous poly-alpha-olefin (APAO)); ethylene-vinyl acetate (EVA) copolymers, styrene block copolymer, polycaprolactone, polycarbonates, fluoropolymers, silicone rubber, polypyrrole elastomer, polyester elastomer, polyurethane elastomer, amid elastomer, polyvinylpyrrolidone elastomer.

A viscosity of the base material (e.g. including or formed from the viscous state 104), e.g. before contacting the substrate 102, may be less than about 1000 pascal seconds (Pa·s), e.g. in the range from about $10^4$ Pa·s to about 1000 Pa·s, e.g. less than about 100 Pa·s, e.g. in the range from about $10^4$ Pa·s to about 100 Pa·s, e.g. less than about 10 Pa·s, in the range from about $10^4$ Pa to about 10 Pa·s, e.g. less than about 1 Pa·s, e.g. in the range from about $10^4$ Pa to about 1 Pa·s, e.g. less than about $10^{-1}$ Pa·s, e.g. less than about $10^{-2}$ Pa·s, e.g. less than about $10^{-3}$ Pa·s.

The base material (e.g. the hot-melt material) may include a viscosity-transition temperature (e.g. at atmospheric pressure), e.g. at least one of: a melting temperature, a solidification temperature, or a glass transition temperature (also referred to as glass-liquid transition temperature), in the range from about 30 C to about 200 C, e.g. in the range from about 30 C to about 150 C, e.g. in the range from about 30 C to about 100 C, e.g. in the range from about 30 C to about 90 C, e.g. in the range from about 30 C to about 80 C, e.g. in the range from about 30 C to about 70 C, e.g. in the range from about 50 C to about 70 C. Alternatively, viscosity-transition temperature may be smaller than about 50° C., e.g. smaller than about 30 C such that the base material (e.g. including or formed from the viscous state 104) may be processed in a cooled environment. Alternatively or additionally, the viscosity-transition temperature may be greater than about 200° C., such the base material (e.g. including or formed from the viscous state 104) may be processed in a heated environment.

The viscosity-transition temperature (e.g. at atmospheric pressure) may be understood as a temperature at which the base material (e.g. including or formed from the viscous state 104) changes from a viscous (also referred to as flowing) state into a non-viscous (also referred to as non-flowable) state. In the viscous state 104, a deformation of the base material may be induced by at least one of gravity force or surface tension. In the non-viscous state 106, the base material may withstand deformation induced by at least one of gravity force or surface tension.

For example, the non-viscous state 106 includes or is formed from a hot-melt material in solid state and the viscous state 104 includes or is formed from a hot-melt material in liquid state.

The glass transition temperature may be understood as reversible transition (e.g. at atmospheric pressure) in amorphous materials (or in amorphous regions within semi-crystalline materials) from a non-pliable (illustratively, hard and relatively brittle) state into a pliable state, e.g. a molten state or glass transition state. In the non-pliable state the base material may include or be formed from the non-viscous state 106. In the pliable state the base material may include or be formed from the viscous 104 state. Illustratively a glass transition may reduce the viscosity of a material before it melts. Above its glass transition temperature and below its melting temperature (also referred to as melting point), the viscosity of the base material (e.g. including or formed from the viscous state 104) may be changed without an associated phase change. For example, in case of a thermoplastic, the viscosity may be reduced by heating.

The melting temperature may be understood as temperature at which the base material changes its state from solid state (including the non-viscous state) to liquid state (e.g. at atmospheric pressure), also referred to as phase change. When considered as the temperature of the reverse change from liquid state to solid state, the viscosity-transition temperature may be referred to as solidification temperature (also referred to as the freezing point or crystallization point). For some materials the melting temperature and the solidification temperature may slightly differ, e.g. for mixtures of more than one chemical substance. Between the solidification temperature and the melting temperature may be a temperature range. In this case, the viscosity-transition temperature may optionally refer to the solidification temperature.

A thermoplastic (also referred to as thermo-softening plastic), may be understood as a material, e.g. a plastic (e.g. a polymer), that becomes pliable or moldable above the viscosity-transition temperature and solidifies upon cooling, e.g. melting and solidification may be reversible. A thermoplastic may include or be formed from polymer chains associated through intermolecular forces, which weaken rapidly with increased temperature, yielding a viscous material 104 (also referred to as liquid material). A thermoplastic may be transferred into a pliable state by heating.

A brittleness of the base material, e.g. a thermoplastic, may be decreased by the addition of plasticizers, which increases the mobility of amorphous chain segments to a lower glass transition temperature. Modification of the polymer through copolymerization or through the addition of non-reactive side chains to monomers before polymerization may also lower the glass transition temperature.

A thermoset, also referred to as thermosetting polymer or plastic, may include or be formed from a pre-polymer material that cures irreversibly through a chemical reaction, in other words, through changing its chemical structure. The cure may be induced by heat, e.g. above 200° C., or an irradiation of the thermoset, e.g. by light or electrons. In other words, by at least one of heating or irradiating the thermoset, its viscosity may be increased. In this case, the viscosity-transition temperature may also refer to a temperature (initiation temperature) at which the chemical reaction starts (initiated). For example, the substrate may have a temperature greater than the initiation temperature, wherein before disposing, the base material (e.g. including or formed from the viscous state 104) may have a temperature smaller than the initiation temperature. For example, an elastomer may be a thermoset.

Thermoplastic elastomers (TPE), also referred to as thermoplastic rubber, may include or be formed from copolymers or a physical mix of polymers including materials with both thermoplastic and elastomeric properties. For example, a thermoset elastomer may include a cross-linking bond structure (in contrast to a thermoplastic elastomer) which enable the elastomeric properties.

According to various embodiments, the base material (e.g. including or formed from the viscous state 104) may include at least one additive selected from the following additives: wax; tackifying resin, plasticizer, antioxidant, stabilizer, UV stabilizers protect.

According to various embodiments, the base material (e.g. including or formed from the viscous state 104) may include or be formed from a photoactive material. The photoactive material may be configured to change its chemical structure if irradiated, e.g. irradiated by light having a developer wavelength. In other words, the photoactive material may define a wavelength to which the chemical structure of the photoactive material is sensitive (also referred to as developer wavelength). In other words, the developer wavelength may refer to as a wavelength, which initiates a change in the viscosity of the base material (e.g. including or formed from the viscous state 104).

The viscosity of the base material (e.g. including or formed from the viscous state 104), e.g. including the photoactive material, may be adjusted by exposing the base material to light having a developer wavelength of the photoactive material. According to various embodiments, the viscosity of the base material (e.g. including or formed from the viscous state 104), e.g. the photoactive material, may be increased by irradiation, e.g. exposure to light.

According to various embodiments, the base material (e.g. including or formed from the viscous state 104, e.g. at least a portion 104p of the base material) may be disposed 104d over a contact region 314 of the substrate 102. The contact region 314 may be a region of the substrate 102 designated to be covered by the base material (e.g. including or formed from the viscous state 104). The contact region 314 may be a region of the substrate 102 designated to be unprocessed (masked) for at least one following process. The base material (e.g. including or formed from the viscous state 104) may contact the substrate 102 in the contact region 314 (in at least a portion of the contact region 314) defining a position of the base material relative to the substrate 102.

The base material (e.g. including or formed from the viscous state 104) may be distributed over the contact region 314 of the substrate 102 according to a predetermined spatial distribution (e.g. at least one of a spatial material distribution or a spatial coverage distribution), e.g. which defines at least one of: an amount of the base material (e.g. including or formed from the viscous state 104) disposed 104d per area of the substrate 102; at least one region (one or more regions) of the substrate 102 which are designated to be covered by the base material (e.g. including or formed from the viscous state 104); at least one region of the substrate 102 in which the substrate 102 may be uncovered. For example, the predetermined spatial distribution may include a predetermined pattern (which defines at least one region in which the substrate 102 may be uncovered and at least one region in which the substrate 102 may be covered).

The base material (e.g. including or formed from the viscous state 104) may be disposed 104d using a disposing device, e.g. a printer, which may be configured to distribute the base material (e.g. including or formed from the viscous state 104) according to the predetermined spatial distribution. The base material (e.g. including or formed from the viscous state 104) may be disposed 104d sequentially, for example, by disposing 104d a plurality of portions 104p of the base material (e.g. including or formed from the viscous state 104) separated by at least one of: spatial distance (in other words, separated by a spatial distance from each other), or a time distance (in other words, separated by a time period), e.g. by at least one of dropping, or spraying the base material (e.g. including or formed from the viscous state 104) onto the substrate 102. Alternatively or additionally, the base material (e.g. including or formed from the viscous state 104) may be disposed 104d continuously, e.g. be a continuous flow of the base material onto the substrate 102. Alternatively or additionally, the base material (e.g. including or formed from the viscous state 104) may be disposed 104d collectively (e.g. within in a period shorter than the contacting period), e.g. a plurality of portions of the base material.

According to various embodiments, the base material (e.g. including or formed from the viscous state 104) may be heated prior to disposing 104d the base material over the substrate 102, e.g. prior to contacting the substrate 102. Heating the base material prior to disposing 104d the base material over the substrate may be configured such that a temperature of the base material (e.g. including or formed from the viscous state 104) before contacting the substrate is greater than the viscosity-transition temperature, e.g. greater than the melting temperature of the base material or smaller than the initiation temperature of the base material.

According to various embodiments, the base material (e.g. including or formed from the viscous state 104) may be free of a volatile solvent, for example, if the base material (e.g. including or formed from the viscous state 104) includes or is formed from the molten base material. In form of a solution, the base material (e.g. including or formed from the viscous state 104) may include at least one volatile solvent.

According to various embodiments, the substrate 102 may include the surface 102s, which is contacted by the base material (e.g. including or formed from the viscous state 104). For example, the surface 102s may be a surface of a semiconductor region of the substrate 102 or a metal region of the substrate 102.

Optionally, at least one layer (e.g. including or formed from a contact pad) may be formed at least one of in or over the semiconductor region of the substrate 102. In this case, the at least one layer (also referred to as at least one surface layer) may include the surface 102s.

The surface 102s may include or be formed from at least one of: a semiconductor, or a metal. For example, the at least one surface layer may include or be formed from at least one metal layer, e.g. a porous metal layer. Alternatively or additionally, the at least one surface layer may include or be formed from at least one of: at least one semiconductor layer. According to various embodiments, at least one of the substrate or the at least one surface layer also may include or be formed from other materials, e.g. other porous materials.

Optionally, the surface 102s may be inclined regarding a direction of a gravitational force.

According to various embodiments, a roughness (e.g. an root mean squared roughness) of the surface 102s may be in the range from about 0.1 µm to about 10 µm, e.g. in the range from about 1 µm to about 10 µm, e.g. in the range from about 1 µm to about 5 µm.

According to various embodiments, the at least one layer may include or be formed from at least one of: a barrier layer, a metallization layer, a redistribution layer, a passivation layer.

According to various embodiments, the substrate 102 (e.g. the surface 102s of substrate), e.g. the at least one surface layer (e.g. the surface 102 of the at least one surface layer), may include or be formed from at least one of: a metal, a semiconductor (also referred to as semiconductor material), for example, an oxide including at least one of the metal or the semiconductor (semiconductor oxide or metal oxide respectively), e.g. silicon oxide, a nitride including at least one of the metal or the semiconductor (semiconductor nitride or metal nitride respectively), e.g. silicon nitride, or a dielectric material including at least one of the metal or the semiconductor (e.g. a semiconductor dielectric or a metal dielectric respectively).

According to various embodiments, a metal may include or may be formed from one element of the following group of elements (in other words, a metal may include or may be formed from at least one of): aluminum, copper, nickel, magnesium, chromium, iron, zinc, tin, gold, silver, iridium, platinum, or titanium. Alternatively or additionally, a metal may include or may be formed from, a metal alloy including one element or more than one element of the group of elements. For example a metal alloy may include an intermetallic compound, e.g. an intermetallic compound of gold and aluminum, an intermetallic compound of copper and aluminum, an intermetallic compound of copper and zinc (e.g. "brass") or an intermetallic compound of copper and tin (e.g. "bronze"). According to various embodiments, a metal may be electrically conducting, e.g. having an electrical conductivity larger than about $10^4$ S/m, e.g. larger than about $10^6$ S/m.

According to various embodiments, the surface 102s, e.g. the substrate 102, e.g. the at least one surface layer, may include or be formed from copper.

The method may in 400b include adjusting a viscosity of the base material (e.g. including or formed from the viscous state 104) during a contacting period of the base material (e.g. including or formed from the viscous state 104) and the substrate 102. The contacting period may be understood as a period starting at a first contact between the base material (e.g. as viscous material 104, e.g. at least a portion of the viscous material 104) and the substrate 102. The contacting period may last as long as an interface area between the base material (e.g. as viscous material 104, e.g. at least a portion of the viscous material 104) and the substrate 102 changes, e.g. increases, e.g. by a deformation of the base material (e.g. including or formed from the viscous state 104). In other words, the method may include in 400b adjusting the viscosity of the base material (e.g. including or formed from the viscous state 104) after the base material contacts the substrate 102. For example, the method may include in 400b adjusting the viscosity of the base material (e.g. including or formed from the viscous state 104) during a deformation of the base material (e.g. including or formed from the viscous state 104), e.g. a contact induced deformation.

Optionally, the contacting period may end if an equilibrium state is reached, e.g. in which a movement of the base material stagnates.

Optionally, the method may include in 400b adjusting the viscosity of the base material (e.g. including or formed from the viscous state 104) before the base material gets into contact with the substrate 102, e.g. after the base material (e.g. including or formed from the viscous state 104) is released from a disposing device, e.g. from a printer, e.g. from a nozzle of disposing device. In other words, the method may include in 400b adjusting the viscosity of the base material (e.g. including or formed from the viscous state 104) during the base material is between the substrate 102 and the disposing device, e.g. distant to at least one of the substrate 102 or the disposing device.

According to various embodiments, the method may include in 400b adjusting the viscosity of the base material (e.g. including or formed from the viscous state 104) during the base material is deformed on the substrate 102, e.g. by a contact induced deformation. The deformation of the base material (e.g. including or formed from the viscous state 104) may be induced by at least one of a gravity force, a mass inertia, or a surface tension. Adjusting the viscosity of the base material (e.g. including or formed from the viscous state 104) may at least one of decelerate or stop the deformation of the base material (e.g. including or formed from the viscous state 104).

During the contacting period, e.g. during the deformation of the base material (e.g. including or formed from the viscous state 104), the base material (e.g. including or formed from the viscous state 104) may at least one of completely contact the contact region 314 of the substrate 102, or overlap the contact region 314 of the substrate 102.

Adjusting the viscosity of the base material (e.g. including or formed from the viscous state 104) may include at least one of changing (e.g. increasing or decreasing) the temperature of the base material, or irradiating (e.g. by light or electrons) the base material.

By decreasing the temperature of the base material (e.g. including or formed from the viscous state 104), in other words, by cooling the base material, the base material may be hardened, e.g. solidified or enter a glass transition. By increasing the temperature of the (in other words, by heating) base material (e.g. including or formed from the viscous state 104) the base material may change its chemicals structure, e.g. by a chemical reaction. By irradiating the base material (e.g. including or formed from the viscous state 104), the base material may at least one of change its chemical structure, e.g. by a chemical reaction, or be heated.

For example, the temperature may be changed by heating 402 the base material (e.g. including or formed from the viscous state 104), e.g. if the base material includes or is formed from at least one of a thermoset, or a thermoset elastomer. The base material (e.g. including or formed from the viscous state 104) may be heated by transferring thermal energy into the base material, e.g. by at least one of: thermal radiation 402, a thermal conduction 406 to the substrate 102, or a thermal conduction 402 to a heating medium (e.g. a gas). Alternatively, the temperature may be changed by cooling 402 the base material (e.g. including or formed from the viscous state 104), e.g. if the base material includes or is formed from at least one of: a thermoplastic, or a thermoplastic elastomer. The base material (e.g. including or formed from the viscous state 104) may be cooled by transferring thermal energy out of the base material, e.g. by at least one of: thermal radiation 404, a thermal conduction 408 to the substrate 102, or a thermal conduction 404 to a heating medium (e.g. a gas). For cooling the base material (e.g. including or formed from the viscous state 104), a contact temperature (e.g. defined by a temperature of the substrate 102 (substrate temperature) may be less than a temperature of the base material (e.g. before contacting the substrate 102), e.g. less than the solidification temperature of the base material.

Alternatively or additionally, the base material (e.g. including or formed from the viscous state 104) may be irradiated by radiation 402 (e.g. light, electrons, protons, etc.) which is configured to induce a chemical reaction (a chemical change respectively) in the base material (e.g. including or formed from the viscous state 104). The chemical reaction (the chemical change respectively) may be understood as transforming one set of chemical substances into another set of chemical substances, e.g. by at least one of: changing the positions of electrons, forming chemical bonds, or breaking of chemical bonds.

Due to the chemical reaction, the base material (e.g. including or formed from the viscous state 104) may be at least partially cured. Curing may refer to the toughening or hardening of the base material by cross-linking of polymer chains, brought about by electron beams, heat, or chemical additives. When the base material (e.g. including or formed from the viscous state 104), e.g. the photoactive material (e.g. additives) is activated by irradiation the process may be referred to as radiation cure, e.g. UV cure for the case of ultraviolet (UV) radiation.

According to various embodiments, the adjusting the viscosity may include forming a first region 104a of the base material and a second region 104b of the viscous material 104, wherein the first region 104a of the base material differs from the second region 104b of the base material in at least one of: a viscosity, a temperature, a chemical structure. For example, a viscosity of the first region 104a of the base material may be greater than a viscosity of the second region 104b of the base material. For example, the first region 104a may include or be formed from the non-viscous state 106, wherein the second region 104b may include or be formed from the viscous state 104.

Adjusting the viscosity may include forming at least one region 104a, 104b of the base material in which the base material sustains at least one of: the gravity force, or the surface tension. Illustratively, the deformation of the base material due to at least one of the gravity force or the surface tension may be at least one of decelerated or stopped by adjusting the viscosity, e.g. increasing the viscosity in at least one of the first region 104a of the base material or the second region 104b of the base material, e.g. by changing at least one of a temperature or a chemical structure in at least one of the first region 104a of the base material or the second region 104b of the base material.

According to various embodiments, the base material (e.g. including or formed from the viscous state 104) is cooled by the substrate 102. In this case, the first region 104a of the base material may be disposed between the second region 104b of the base material 104 and the substrate 102 (e.g. the first region 104a of the base material may be in contact with the substrate 102), wherein a viscosity of the first region 104a of the base material may be greater than a viscosity of the second region 104b of the base material.

Adjusting the viscosity of the base material (e.g. including or formed from the viscous state 104) may be configured to stabilize an arrangement of the base material, wherein the arrangement includes at least one of: a position of the base material (e.g. a position of each portion of the base material) or a spatial distribution of the base material, e.g. as disposed 104d, e.g. as contacting the substrate 102. At least one of the position of the base material or the spatial distribution of the base material may be defined by the region in which the base material (e.g. including or formed from the viscous state 104) contacts the substrate 102. In other words, at least one of the position or the spatial distribution of the base material relative to the substrate 102, e.g. relative to the contact region 314, may be maintained.

According to various embodiments, a first portion 104p of the base material (e.g. including or formed from the viscous state 104) may be transformed into a non-viscous state, e.g. at least one of cured or solidified, before a second portion 104p of the base material (e.g. including or formed from the viscous state 104) may be disposed at least one of over the substrate 102 or over the first portion of the base material (e.g. including or formed from the viscous state 104). For example, the second portion 104p may be adjacent to the first portion 104p after it has been disposed.

The viscosity of the base material including or formed from the non-viscous state 106, e.g. after contacting the substrate 102, may be greater than the viscosity of the base material including or formed from the viscous state 104, e.g. before contacting the substrate 102, e.g. greater than about 100%, e.g. greater than about 500%, e.g. greater than about 1000%. For example, the a viscosity of the base material including or formed from the non-viscous state 106, e.g. after contacting the substrate 102, may be greater than about 1000 Pa·s, e.g. greater than about $10^4$ Pa·s, e.g. greater than about $10^5$ Pa·s, e.g. greater than about $10^6$ Pa·s, e.g. greater than about $10^7$ Pa·s, e.g. greater than about $10^8$ Pa·s, e.g. greater than about $10^9$ Pa·s.

Adjusting the viscosity may transform the base material (e.g. including or formed from the viscous state 104) into the non-viscous state 106 (also referred to as non-viscous material 106), e.g. at least one of a solid state or a cured state, e.g. by at least one of curing the base material or solidifying the base material. After adjusting the viscosity, the base material may include or be formed from the non-viscous state 106 (to form a protection layer). For example, the non-viscous material 106 includes or is formed from a hot-melt material in solid state and the viscous material 104 includes or is formed from a hot-melt material in at least one of a liquid state or a glass transition state.

Adjusting the viscosity of the base material (e.g. including or formed from the viscous state 104) may be configured to adjust a thickness 104t of the base material (e.g. the protection layer formed therefrom). The thickness 104t of the base material may depend on the time period between the first contact (when deformation starts) of the base material with the substrate and the stabilization of the base material, in other words, the time period in which the base material may be deformable (also referred to as contacting time period), e.g. by at least one of: the gravity force, or the surface tension. Illustratively, the thickness 104t of the base material may decrease with increasing contacting period. In other words, the faster the viscosity of the base material is increased, the less time the base material has to flow in all directions. Alternatively or additionally, the amount of the base material disposed 104d over the substrate 102 may be adjusted.

According to various embodiments, adjusting the thickness 104t of the base material (e.g. including or formed from the viscous state 104) may include or be formed from adjusting a temperature difference between the base material (e.g. including or formed from the viscous state 104) and the contact temperature (e.g. the substrate temperature) before the base material contacts the substrate, e.g. a surface 102s of the substrate 102. The greater the temperature difference is, the greater the contacting period may be. According to various embodiments, at least one of: the contact temperature (e.g. the temperature of the substrate 102) or the temperature of the base material (e.g. including or formed from the viscous state 104) may be adjusted, e.g. simultaneously or separately from each other. The greater the contact temperature is, the longer the contacting period may be. Alternatively or additionally, the greater the temperature of the base material (e.g. including or formed from the viscous state 104) is, the greater the contacting period may be.

According to various embodiments, adjusting the thickness 104t of the base material (e.g. including or formed from the viscous state 104) may include or be formed from adjusting an amount of the base material (e.g. including or formed from the viscous state 104) disposed 104d over the substrate 102 (e.g. over the contact region 314), e.g. sequentially. The more base material (e.g. including or formed from the viscous state 104) over the substrate 102, e.g. the contact region 314, is disposed 104d the greater the thickness 104t of the base material (or the protection layer 108 respectively) may be. For example, additional base material (e.g. including or formed from the viscous state 104) may be formed over the already stabilized base material (e.g. including or formed from the non-viscous state 106), e.g. the already solid base material, to increase the thickness of the base material. Alternatively or additionally, a volume of a portion of the base material (e.g. including or formed from the viscous state 104) may be increased to increase the thickness of the viscous material 104, e.g. a drop volume.

According to various embodiments, adjusting the thickness 104t of the base material (or the protection layer 108 respectively) may include or be formed from adjusting an intensity of light having a developer wavelength to which the base material (e.g. including or formed from the viscous state 104) is exposed. The less the intensity of the light is, the greater the contacting period may be.

According to various embodiments, adjusting the thickness 104t of the base material (e.g. including or formed from the viscous state 104) may include or be formed adjusting a wavelength of radiation, e.g. light, to which the base material (e.g. including or formed from the viscous state 104) is exposed (also referred to as exposure wavelength). The greater a difference between the exposure wavelength and the developer wavelength is, the greater the contacting period may be.

According to various embodiments, the method may include in 400b forming a protection layer 108. The protection layer 108 may include or be formed from the non-viscous state 106 of the base material (non-viscous material 106). The non-viscous material 106 may also include or be formed from an amorphous material.

The protection layer 108 may cover at least the contact region 314 of the substrate 102. Further, at least one other region 316 (at least one processing region 316) may be exposed from (uncovered by) the protection layer 108.

The method may include in 400c processing the substrate 102 using the protection layer 108 as mask. Processing the substrate 102 may include or be formed from at least one of: etching the substrate 102 (e.g. using at least one of: an gaseous etchant; a liquid etchant; a plasma etchant; or an ion etchant); doping the substrate 102 (e.g. using at least one of: a gaseous doping source; using a liquid doping source; or using a ion doping source, also referred to as ion implantation); depositing material over the substrate 102 (e.g. using at least one of: a gaseous deposition source; a liquid deposition source; or a plasma deposition source); or reacting the substrate 102 (e.g. e.g. using at least one of: a gaseous reactant; a liquid reactant; a ion reactant).

By processing the substrate 102 the at least one (uncovered) region 316 (processing region 316) may be processed, e.g. a processed region 316 of the substrate 102 may be formed. Illustratively, the at least one processing region 316 may refer to at least one region of the substrate 102 in which the substrate 102 is designated to be processed. At least the contact region 314 may be unprocessed.

The method may include in 400c removing the protection layer 108 after processing the substrate 102. By removing the protection layer 108 at least the contact region 314 may be exposed.

Figure 5A:
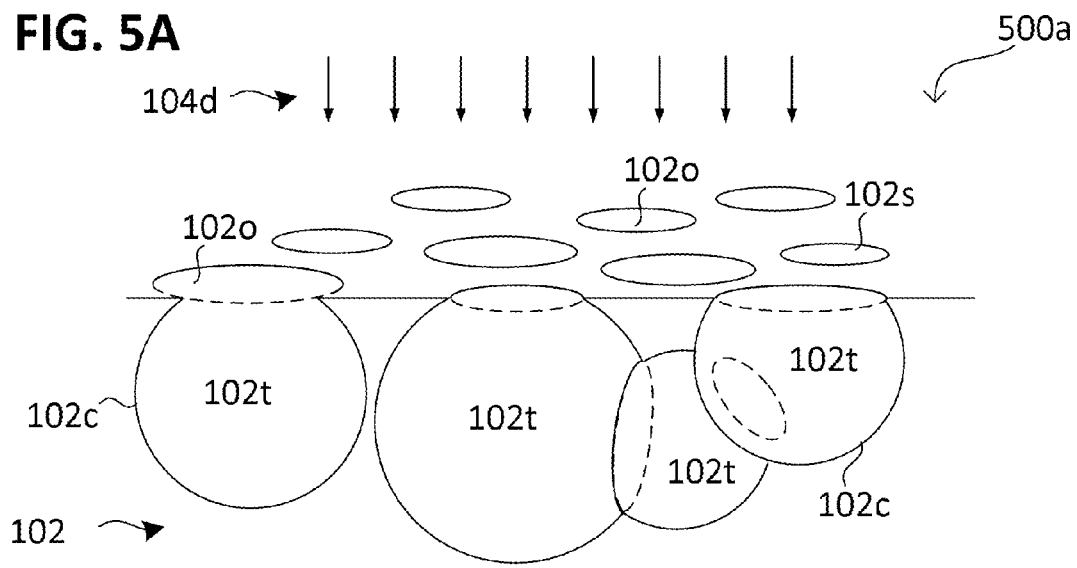
FIG. 5A and FIG. 5B respectively show a method according to various embodiments in a schematically perspective view or schematically cross sectional view.
Figure 5B:
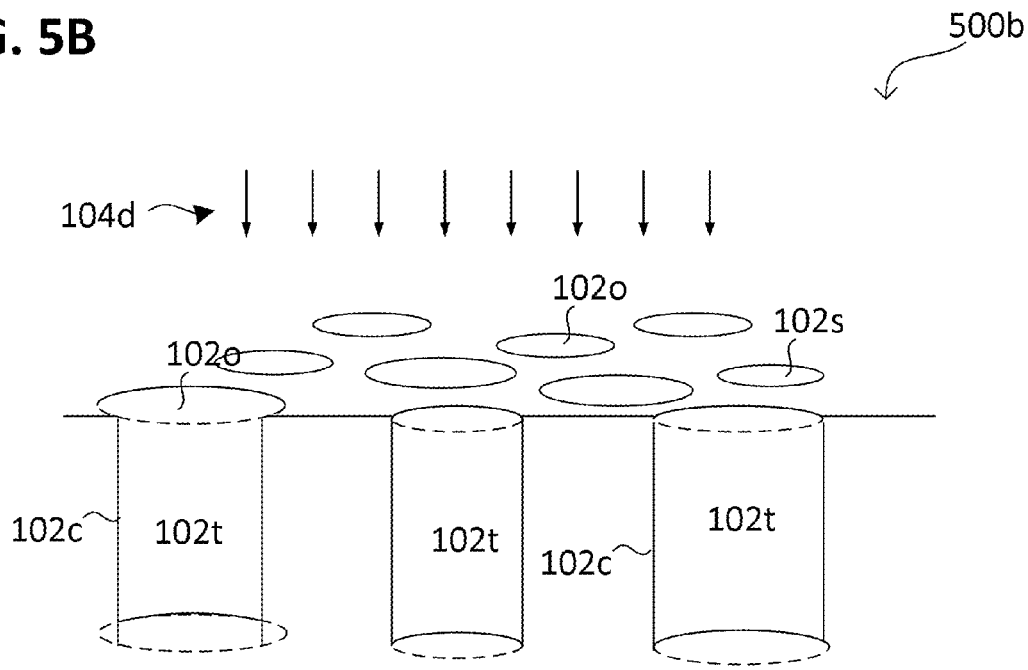

FIG. 5A and FIG. 5B respectively show a method according to various embodiments in a schematically perspective view or schematically cross sectional view. The method may include in 500a and 500b disposing 104d the base material (e.g. including or formed from the viscous state 104) over the substrate 102. The substrate 102, e.g. the surface 102s, may include or be formed from at least one topography feature 102t (in other words, one or more topography features 102t, e.g. a plurality of topography features 102t) extending into the substrate 102. The at least one topography feature 102t may include or be formed from an opening 102o in the surface 102s. The at least one topography feature 102t may include a concave surface 102c.

According to various embodiments, a size (e.g. a spatial averaged size) of the at least one topography feature 102t may be in the range from about 0.1 μm to about 10 μm, e.g. in the range from about 0.5 μm to about 10 μm, e.g. in the range from about 1 μm to about 5 μm. The size may define at least one of an extension of the at least one topography feature 102t parallel to the surface 102s (e.g. a lateral extension of the opening 102o); or an extension of the at least one topography feature 102t into the substrate, e.g. perpendicular to the surface 102s.

The at least one topography feature 102t may in 500a include or be formed from at least one pore (also referred to as porous structure). In other words, the at least one pore may be opened through the surface 102s. Optionally, at least two pores of the at least one pore may be interconnected to each other, e.g. by adjoining each other and/or by other pores. A distance between the pores of the at least one pore may be smaller than at least one of: their extension perpendicular to the surface 102s, or their extension parallel to the surface 102s.

The at least one topography feature 102t may in 500b include or be formed from at least one hole (also referred to as hole structure). The holes of the at least one hole may be separated from each other. The extension of the holes of the at least one hole into the substrate 102 may be greater than at least one of: their extension perpendicular to the surface 102, or their distance to each other.

Figure 6A:
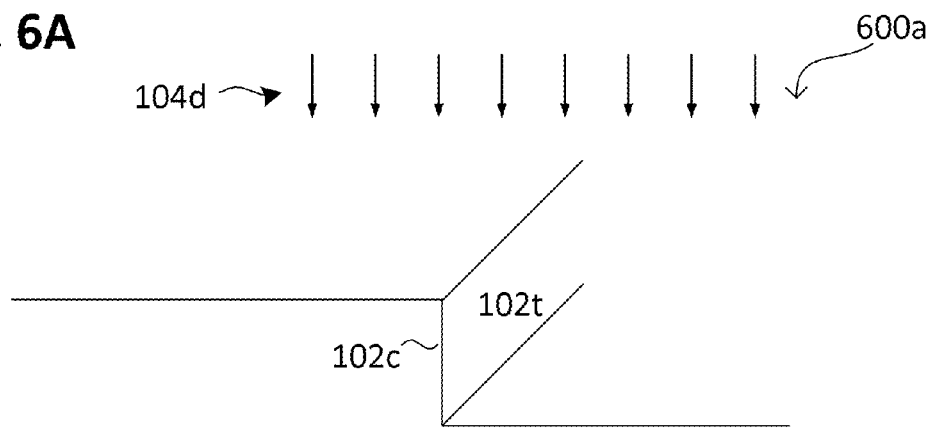
FIG. 6A to FIG. 6C respectively show a method according to various embodiments in a schematically perspective view or schematically cross sectional view.
Figure 6B:
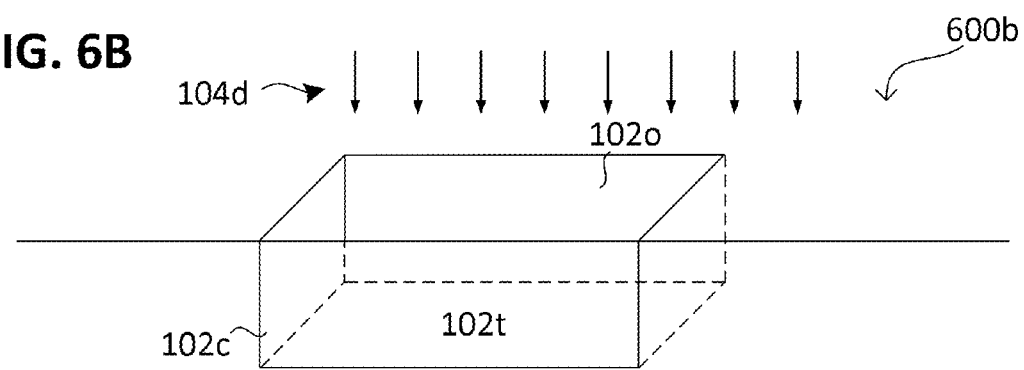
Figure 6C:
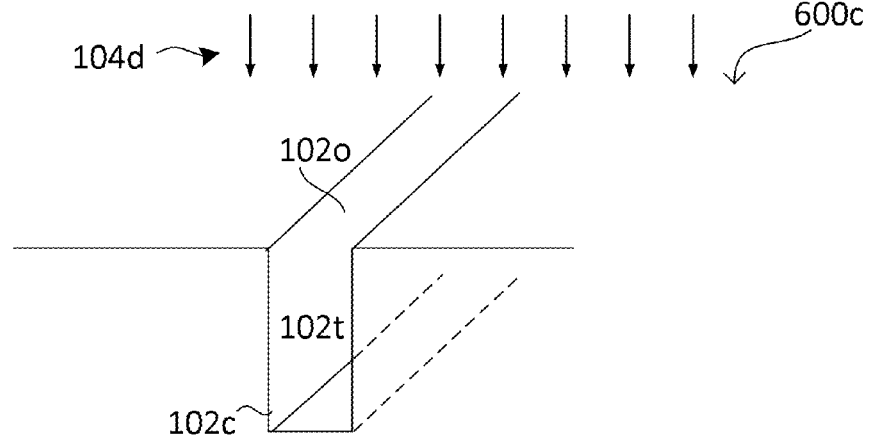

FIG. 6A, FIG. 6B and FIG. 6B respectively show a method according to various embodiments in a schematically perspective view or schematically cross sectional view. The method may include in 600a, 600b and 600c disposing 104d the base material (e.g. including or formed from the viscous state 104) over the substrate 102. The substrate 102, e.g. the surface 102s, may include or be formed from at least one topography feature 102t extending into the substrate 102. The at least one topography feature 102t may include a concave surface 102c.

The at least one topography feature 102t may in 600a include or be formed from at least one step (also referred to as step structure).

The at least one topography feature 102t may in 600b include or be formed from at least one recess (also referred to as recess structure).

The at least one topography feature 102t may in 600c include or be formed from at least one trench (also referred to as trench structure). Each trench of the at least one trench may be extended in a direction perpendicular to the surface 102s. The extension of the trenches of the at least one trench in a direction parallel to the surface 102s may be greater than at least one of a distance between them or an extension of them perpendicular to the surface 102. In other words, the at least one trench may be elongated.

According to various embodiments, the base material (e.g. including or formed from the viscous state 104) may be disposed such, that the base material (or the protection layer 108 respectively) covers the at least one topography feature 102t.

Figure 7:
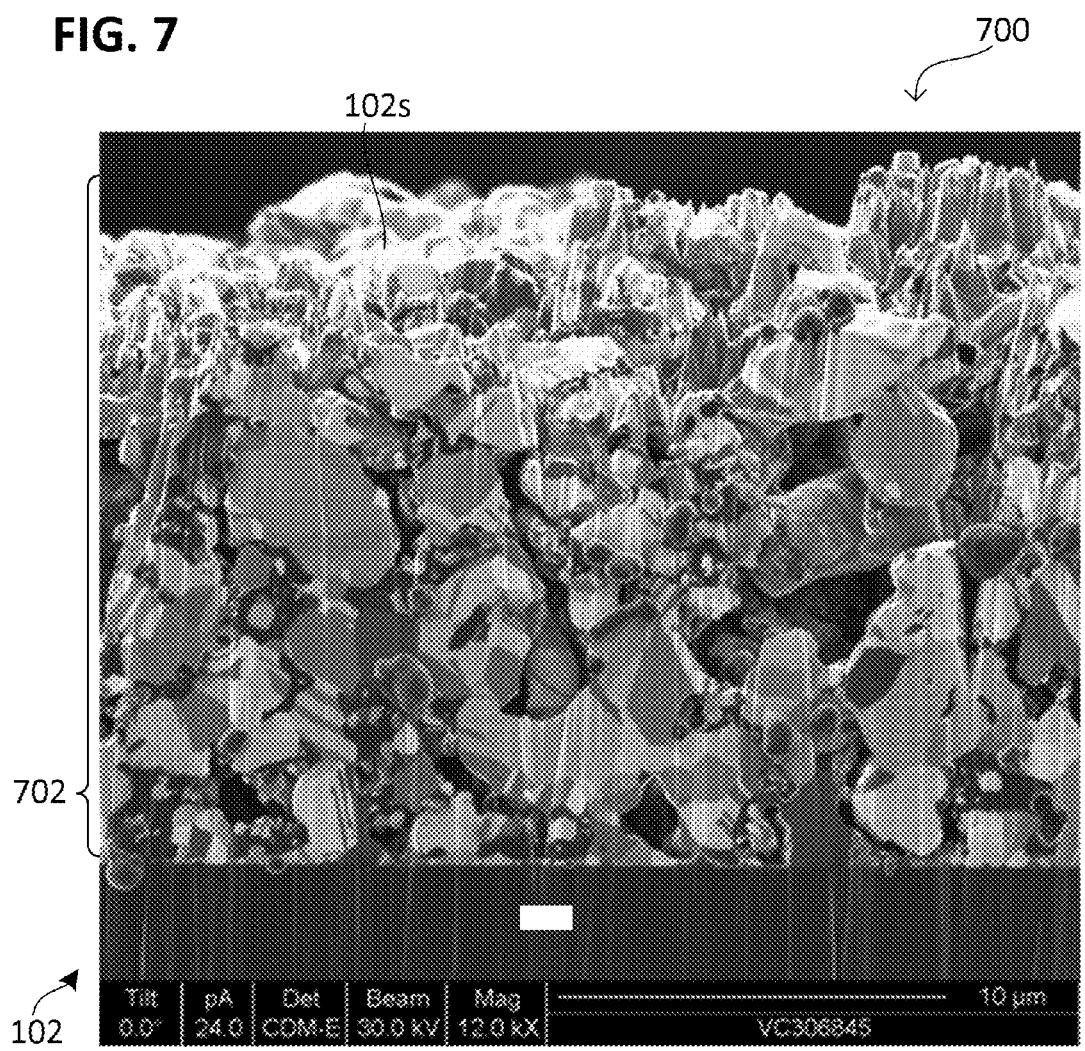
FIG. 7 shows a method according to various embodiments in a schematically side view or schematically cross sectional view.

FIG. 7 illustrates a method according to various embodiments in a schematically side view or schematically cross sectional view;

According to various embodiments, the method may include in 700a forming a porous structure 702 at least one of over or in substrate 102, e.g. over a semiconductor region 704 of the substrate 102. For example, the porous structure 702 may include or be formed from a layer formed at least one of over or in substrate 102, e.g. a porous contact pad.

According to various embodiments, the porous structure 702 may include or be formed from a porous metal layer. Alternatively or additionally, the porous structure 702 may include or be formed from a porous semiconductor layer.

According to various embodiments, the porous structure 702 may be formed by a printing process, e.g. a paste printing process (e.g. a stencil printing process and/or a screen-printing process), e.g. a metal paste printing (e.g. using a metal-containing paste). Alternatively or additionally, the porous structure 702 may be formed by a plasma dust deposition (e.g. using a dusty plasma).

According to various embodiments, a porosity of the porous structure 702 may be in the range from about 20% to about 80%, e.g. in the range from about 20% to about 70%, e.g. in the range from about 20% to about 50%, e.g. in the range from about 20% to about 30% or in the range from about 30% to about 40%.

According to various embodiments, a pore size (e.g. an spatial averaged pore size) of the porous structure 702 may be in the range from about 0.1 μm to about 10 μm, e.g. in the range from about 0.5 μm to about 10 μm, e.g. in the range from about 1 μm to about 5 μm. The pore size may define at least one of an extension of the pores of the porous structure 702 parallel to the surface 102s; or an extension of the pores of the porous structure 702 into the substrate, e.g. perpendicular to the surface 102s.

According to various embodiments, a roughness (e.g. an root mean squared roughness) of the porous structure 702 may be in the range from about 0.1 µm to about 10 µm, e.g. in the range from about 1 µm to about 10 µm, e.g. in the range from about 1 µm to about 5 µm.

According to various embodiments, the porous structure 702 may include or be formed from a plurality of pores. According to various embodiments, at least one pore of the porous structure 702 (e.g. a plurality of pores) may be opened at a surface 102s.

Figure 8A:
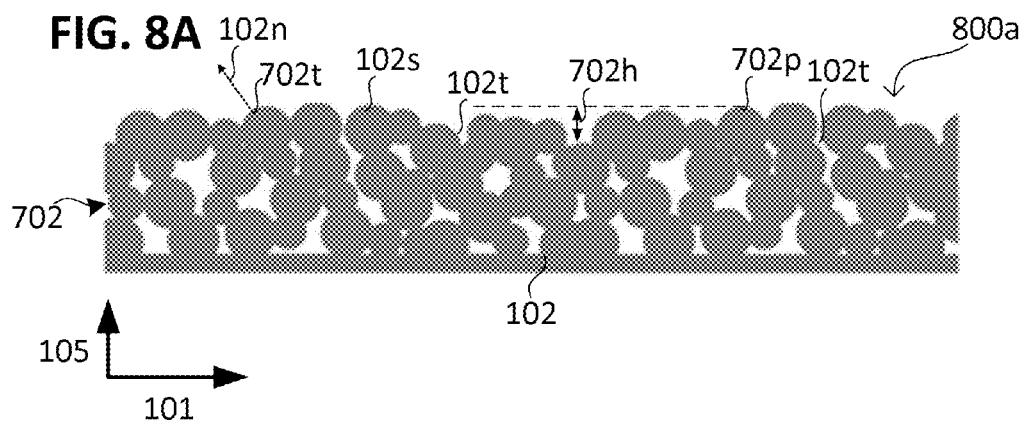
FIG. 8A to FIG. 8C respectively show a method according to various embodiments in a schematically side view or schematically cross sectional view.
Figure 8B:
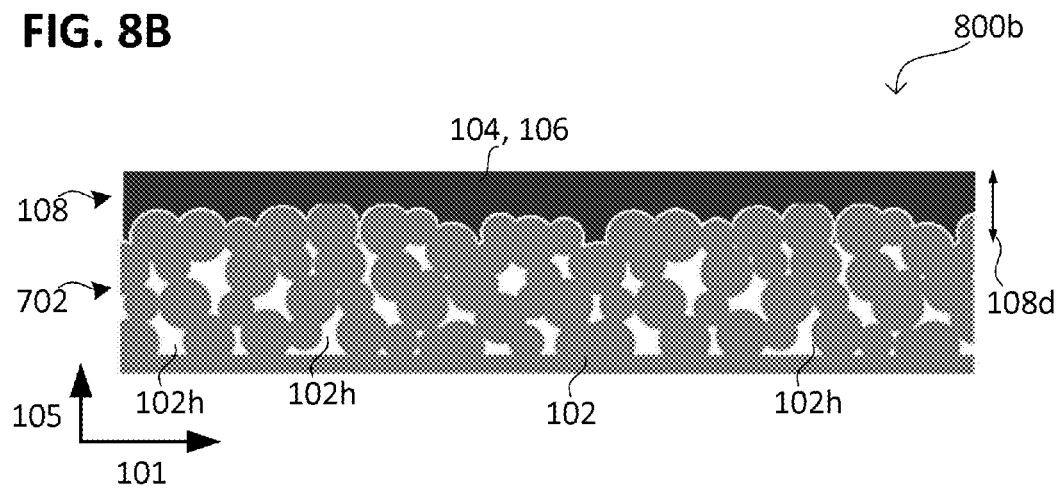
Figure 8C:
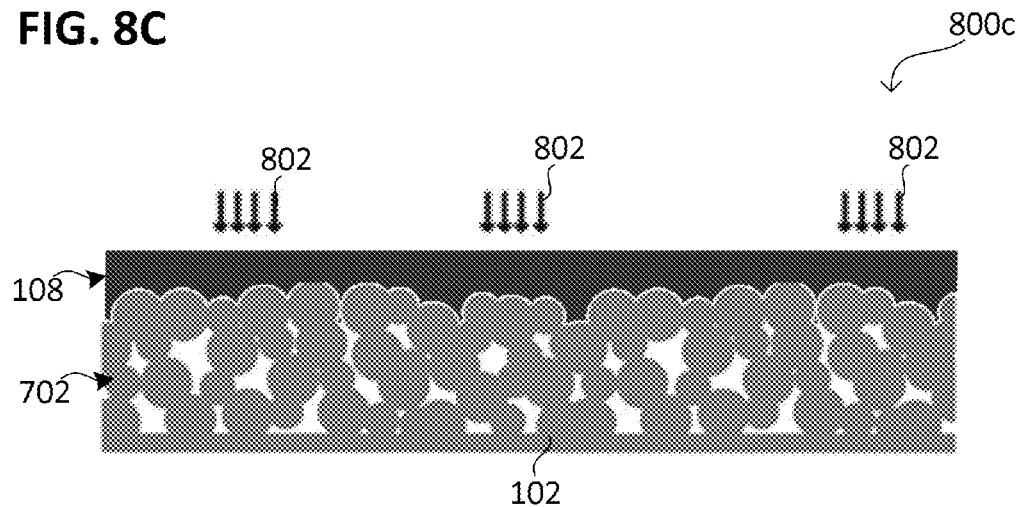

FIG. 8A to FIG. 8C respectively show a method according to various embodiments in a schematically side view or schematically cross sectional view.

According to various embodiments, the method may include in 800a providing a substrate 102 including or formed from a porous structure 702. Optionally, the porous structure 702 may be formed over a semiconductor region.

According to various embodiments, the substrate 102 (e.g. the surface 102s), e.g. the porous structure 702, may include at least one protrusion 702p defining a maximum height variation 702h of the surface. The maximum height variation 702h may define the roughness of the substrate 102 (e.g. the surface 102s), e.g. the porous structure 702.

According to various embodiments, the substrate 102 (e.g. the surface 102s), e.g. the porous structure 702, may include a surface portion 702t having a surface normal 102n which is tilted regarding a gravitational force direction (e.g. direction 105). For example, the surface portion 702t may include or be formed from the contact region 316.

According to various embodiments, the method may in 800b include forming a protection layer 108 (from the base material). The protection layer 108 may be formed over the substrate 102 (e.g. the surface 102s), e.g. the porous structure 702, e.g. by disposing a base material (e.g. including or formed from the viscous state 104) over the substrate 102 and adjusting the viscosity of the base material to stabilize a spatial distribution of the base material (e.g. including or formed from the viscous state 104) as disposed. The viscosity of the base material may be adjusted, such that the base material is substantially not flowing (e.g. seeking) into the topography feature, e.g. into the pores of porous structure 702.

A thickness 108d of the protection layer may be greater than the maximum height variation 702h, e.g. in the region of the maximum height variation 702h. Alternatively or additionally, the thickness 108d of the protection layer 108 may be greater than about 2 µm, e.g. greater than about 4 µm, e.g. greater than about 6 µm, e.g. greater than about 8 µm, e.g. greater than about 10 µm.

According to various embodiments, adjusting the viscosity of the base material (e.g. including or formed from the viscous state 104) is configured to form at least one hollow 120h in the substrate 102, e.g. in the topography feature 102t covered by the base material or the protection layer 108 respectively.

The method may include in 800b transforming the base material at least partially into a non-viscous state 106, e.g. before structuring 802 the protection layer 108.

The at least one topography feature 102t, e.g. the pores underlying the protection layer 108, may include a volume which is smaller than a volume of the base material (or the protection layer 108 formed therefrom). In other words, the protection layer 108 may cover the at least one topography feature 102t without filling the at least one topography feature 102t.

Optionally, the method may include in 800c structuring 802 the protection layer 108 using photolithography, e.g. before processing the surface 102s. The protection layer 108 may be structured according to a predetermined pattern (e.g. a mask pattern).

Figure 9A:
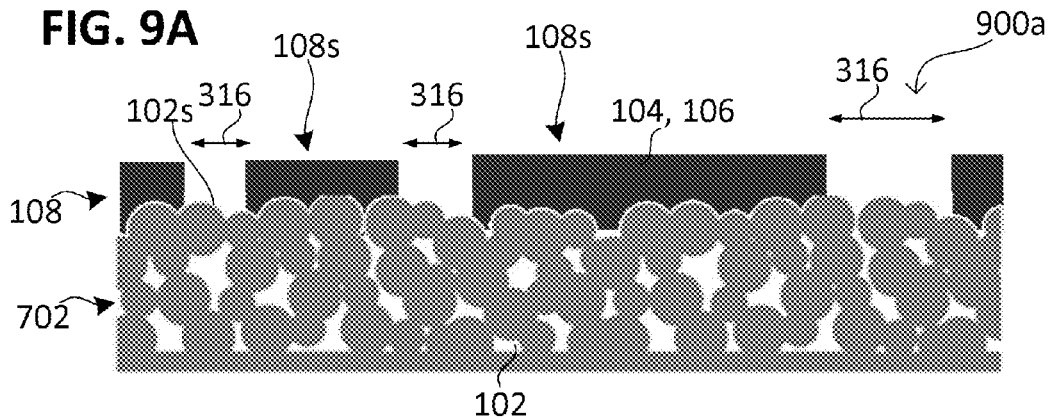
FIG. 9A to FIG. 9C respectively show a method according to various embodiments in a schematically side view or schematically cross sectional view.
Figure 9B:
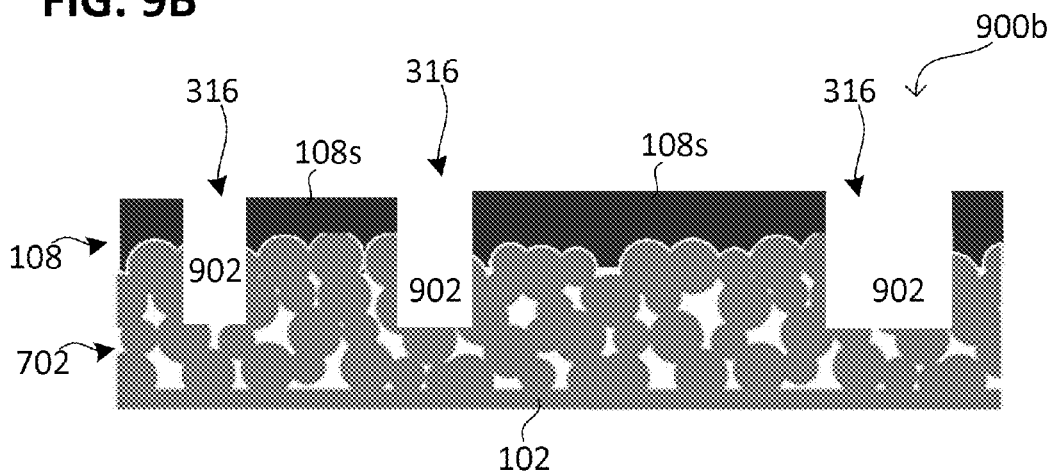
Figure 9C:
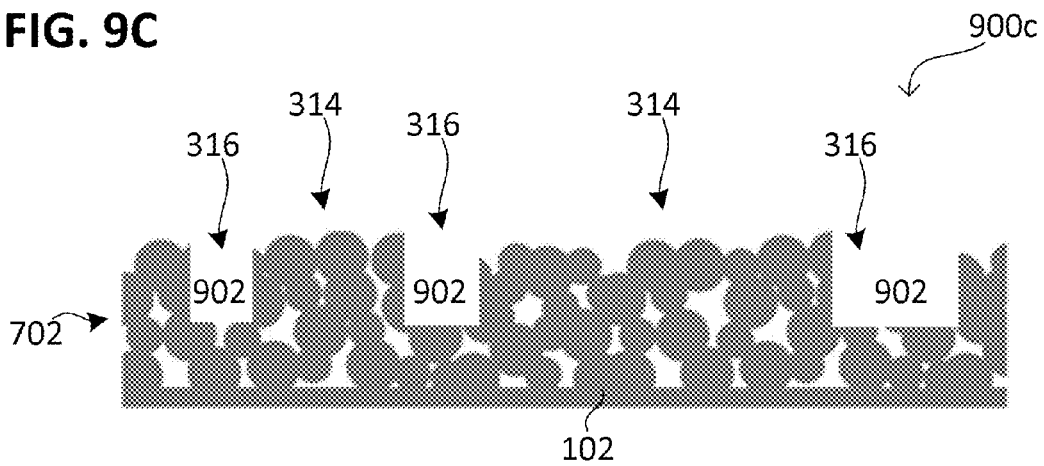

FIG. 9A FIG. 9B and FIG. 9C respectively illustrate a method according to various embodiments in a schematically side view or schematically cross sectional view;

After structuring 802 the protection layer 108 in 800c, at least one processing region 316 of the substrate 102 (e.g. the surface 102s) may be exposed (in other words, uncovered).

Alternatively or additionally to 800c, the method may include in 900a disposing the base material (e.g. including or formed from the viscous state 104) according to a predetermined pattern (e.g. a mask pattern). The predetermined pattern may be configured to leave at least one region 316 of the substrate 102 (e.g. the surface 102s) uncovered. In this case, the method may optionally include in 900a structuring 802 the protection layer 108 using photolithography, e.g. before processing the surface. This may increase the structural accuracy of the protection layer 108.

The method may include in 900b processing the substrate 102, e.g. the surface 102s. The at least one processing region 316 exposed by the protection layer 108 (exposed region) may be processed, e.g. by wet etching (e.g. using a liquid etchant) or dry etching (e.g. using at least one of a gaseous etchant; a plasma etchant; or an ion etchant). For example, at least one trench 902 or recess 902 may be formed in the substrate 102, e.g. in the porous structure 702.

The method may include in 900c removing the protection layer 108, e.g. using a solvent (e.g. an alkaline fluid, an organic fluid, or a water based fluid), e.g. a heated solvent. The heated solvent may include a temperature greater than a temperature of the protection layer 108, e.g. greater than a viscosity-transition temperature of the protection layer 108 (respectively of the base material). Alternatively or additionally, the protection layer 108 may be heated for removing the protection layer 108, e.g. if the protection layer 108 includes or is formed from a hot-melt material (e.g. a thermoplastic).

The method may include in 900c exposing the contact region 314.

Figure 10:
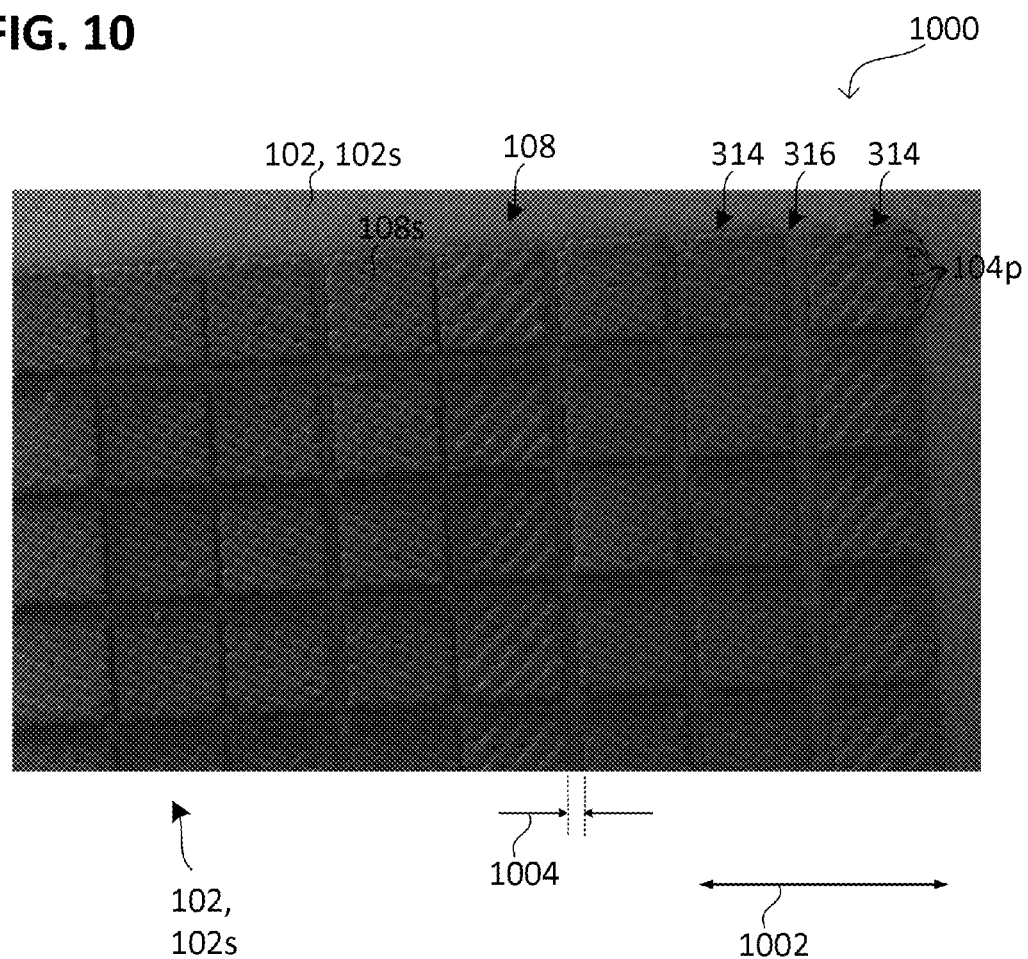
FIG. 10 shows a method according to various embodiments in a schematically top view.

FIG. 10 illustrates a method according to various embodiments in a schematically top view. A length scale 1002 may be in the range from about 0.1 mm to about 10 mm, e.g. in the range from about 0.2 mm to about 5 mm, e.g. in the range from about 0.5 mm to about 2 mm, e.g. about 1 mm.

According to various embodiments, the method may include in 1000 forming the protection layer 108 according to the predetermined pattern. In other words, the method may include in 1000 at least one of the following: structuring the protection layer 108 (e.g. using photolithography) in accordance with the predetermined pattern to expose at least one processing region 316 of surface 102s, disposing 104d the base material (e.g. including or formed from the viscous state 104) on the surface 102s in accordance with the predetermined pattern to leave at least one processing region 316 of surface 102s uncovered; structuring the protection layer 108 (e.g. using photolithography) after disposing 104d the base material (e.g. including or formed from the viscous state 104) on the surface 102s in accordance with the predetermined pattern.

According to various embodiments, the protection layer 108 may include or be formed from a plurality of segments 108s (illustratively, pad regions) being disposed distant from each other. For example, an extension of at least one of: each segment of the plurality of segments 106p (parallel to the surface 102s); or a contact region 314 may be in the range of half the length scale 1002.

Between the segments of the plurality of segments 108s the surface 102s may include at least one (exposed) processing region 316. The at least one processing region 316 may surround each segment of the plurality of segments 108s.

A distance 1004 between two segments 106p of protection layer 108 may be in the range from 5 μm about to about 500 μm, e.g. in the range from 10 μm about to about 250 μm, e.g. in the range from 25 μm about to about 100 μm, e.g. about 50 μm.

According to various embodiments, the surface 102s, e.g. the porous structure 702, may be provided by the at least one surface layer including or formed from an electrically conductive material (also referred to as at least one electrically conductive layer), e.g. having an electrical conductivity larger than about $10^4$ S/m, e.g. larger than about $10^6$ S/m. For example, the at least one surface layer may include or be formed from a metal. In this case, each segment of the plurality of segments 108s may define one contact pad formed from the at least one surface layer.

Alternatively or additionally, the surface 102s may be provided by the at least one surface layer including or formed from a semiconductor material.

According to various embodiments, the protection layer 108 may provide a mask for processing the substrate 102, e.g. including or formed from a hot-melt material, e.g. formed using inkjet-printing.

Figure 11:
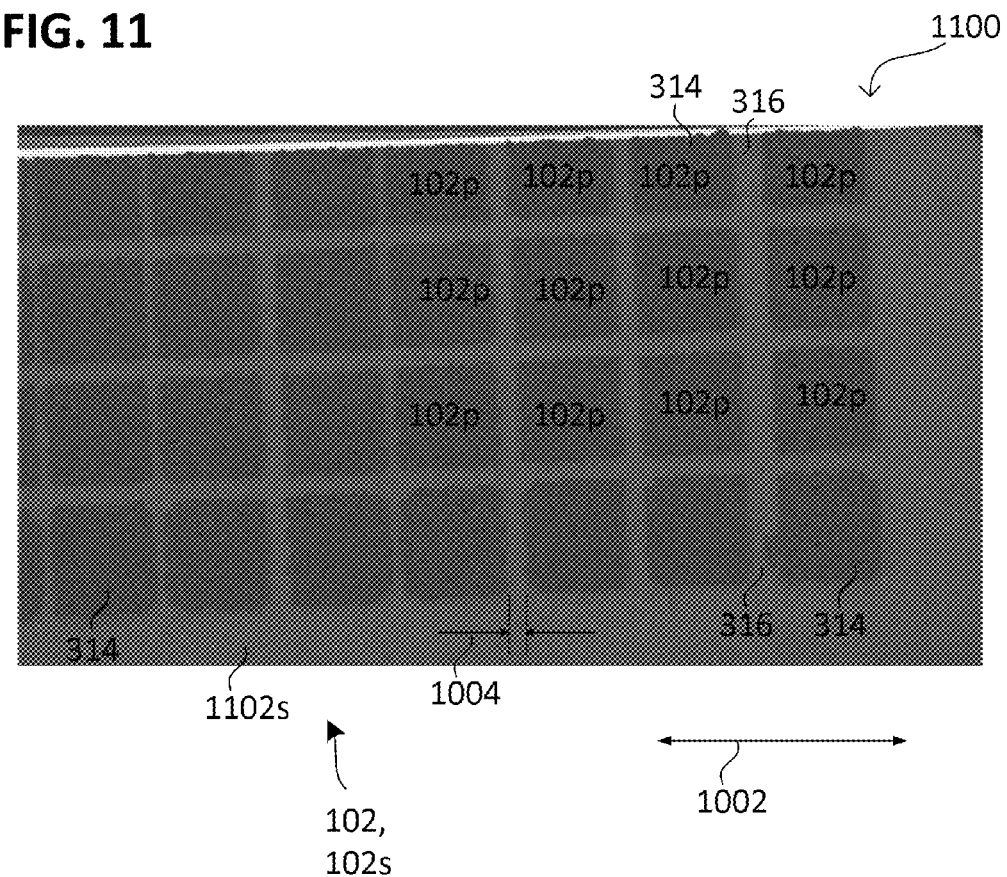
FIG. 11 shows a method according to various embodiments in a schematically top view.

FIG. 11 illustrates a method according to various embodiments in a schematically top view.

The method may include in 1100 processing the substrate 102, e.g. the porous structure 702. The processed at least one processing region 316 (processed region 316) may include or be formed from a trench surrounding the at least one non-processing region 314. In the at least one non-processing region 314 (unprocessed region 314) the substrate 102 may include at least one of: the porous structure 702 or an electrically conductive layer.

According to various embodiments, e.g. if the surface 102s is provided by an electrically conductive layer, each segment of the plurality of segments 108s may define one contact pad 102p formed from the electrically conductive layer.

For example, the at least one electrically conductive layer may include or be formed from a metal, e.g. include or be formed from copper. For example, the at least one electrically conductive layer may be formed from a copper paste, e.g. cured in gaseous formic acid, e.g. for at least 3 hours and the a temperature in the range from about 100° C. to about 600° C., e.g. about 400° C.

According to various embodiments, a thickness of the at least one surface layer (at least one electrically conductive layer) may be in the range from about 5 μm to about 100 μm, e.g. in the range from about 10 μm to about 50 μm e.g. in the range from about 20 μm to about 30 μm, e.g. about 25 μm.

According to various embodiments, a porosity of the at least one surface layer may be in the range from about 20% to about 70%, e.g. in the range from about 30% to about 40%, e.g. about 35%.

According to various embodiments, a roughness (e.g. mean root squared) of the at least one surface layer may be in the range from about 1 μm to about 5 μm, e.g. about 3 μm.

Processing the substrate 102, e.g. the at least one surface layer, may include etching the substrate 102, e.g. using an etchant which may include or be formed from at least one of nitric acid, hydrofluoric acid or acidic acid, e.g. for a time period (processing time) in the range from about 10 minutes to about 60 minutes, e.g. about 25 minutes, e.g. at a substrate temperature in the range from about 20° C. to about 100° C., e.g. about 40° C.

Figure 12A:
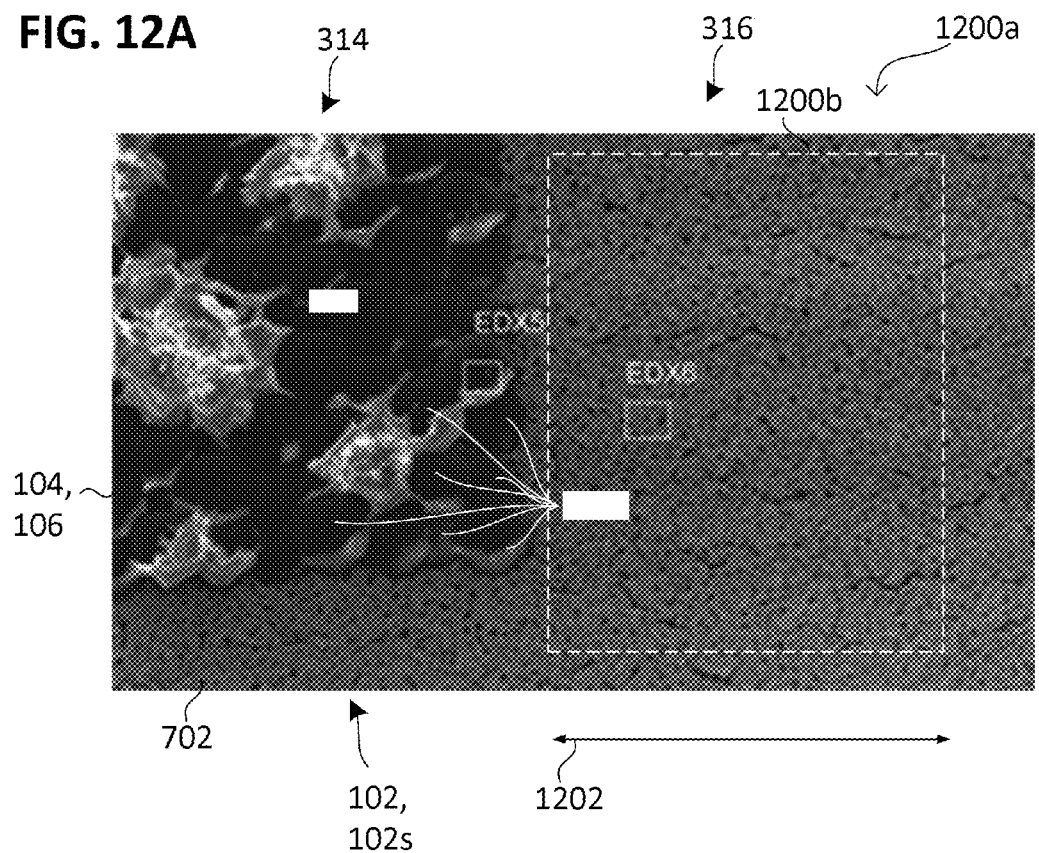
FIG. 12A and FIG. 12B respectively show a method according to various embodiments in a schematically top view.
Figure 12B:
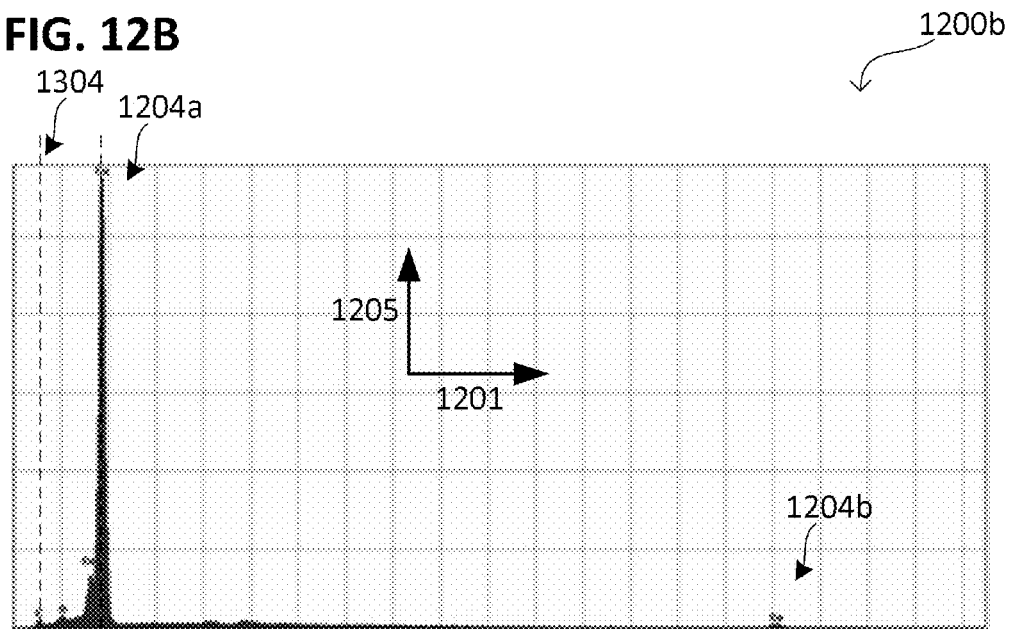

FIG. 12A and FIG. 12B respectively illustrate a method according to various embodiments in a schematically top view.

The method may include in 1200a disposing the base material (e.g. including or formed from the viscous state 104) according to a predetermined pattern. For example, the base material (e.g. including or formed from the viscous state 104) may be disposed using printing. A length scale 1202 may be in the range from about 100 μm to about 500 μm, e.g. about 300 μm.

According to various embodiments, the base material (e.g. including or formed from the viscous state 104), e.g. a plurality of portions 104p of the base material, may be disposed sequentially in a drop-by-drop sequence, e.g. using a drop-on-demand (DOD) process. Disposing the base material (e.g. including or formed from the viscous state 104) may include disposing a predetermined amount of portions 104p (e.g. drops) per area on the substrate 102 (portion density). The portion density (e.g. droplet density) may refer to an amount of portions 104p per length scale or per square area having a side length of the length scale.

According to various embodiments, the portion density may be in the range from about 100 portions 104p per centimeter (corresponding to about 250 portions per inch) to about 500 portions per centimeter (corresponding to about 1300 portions per inch), e.g. in the range from about 150 portions per centimeter (corresponding to about 380 portions per inch) to about 400 portions per centimeter (corresponding to about 1000 portions per inch), e.g. in the range from about 200 portions per centimeter (corresponding to about 500 portions per inch) to about 300 portions per centimeter (corresponding to about 760 portions per inch), e.g. in the range from about 220 portions per centimeter to about 250 portions per centimeter, e.g. about 240 portions per centimeter (corresponding to about 600 portions per inch).

According to various embodiments, the base material (e.g. including or formed from the viscous state 104), e.g. each portion of the plurality of portions 104p, may have a temperature during disposing and before contacting the substrate 102, e.g. the surface 102s above the viscosity-transition temperature, e.g. in the range from about 50 C to about 200° C., e.g. about 90° C.

According to various embodiments, a volume of each portion (e.g. drop) of the plurality of portions 104p may be in the range from about 10 pL to about 50 pL, e.g. about 30 pL.

According to various embodiments, a contact temperature (e.g. a temperature of the substrate 102, e.g. the surface 102s, before contacting the viscous material 104) may be below the viscosity-transition temperature, e.g. in the range from about 25° C. to about 100° C., e.g. about 50° C.

According to various embodiments, a temperature difference between the base material (e.g. including or formed from the viscous state 104), e.g. each portion of the plurality of portions 104p, before contacting the substrate 102, e.g. the surface 102s, and the contact temperature may be in the range from about 10° C. to about 100° C., e.g. about 40° C.

According to various embodiments, the contact temperature, e.g. provided by the substrate 102, e.g. the surface 102s, may be controlled, e.g. to be substantially constant. Therefore, the substrate 102 may be cooled during disposing the base material (e.g. including or formed from the viscous state 104). Alternatively or additionally, the substrate 102 may be heated during disposing the base material (e.g. including or formed from the viscous state 104).

The method may include 1200*a* disposing the base material (e.g. including or formed from the viscous state 104) such that the at least one processing region 316 is free from the base material (e.g. including or formed from the viscous state 104), as illustrated schematically in an chemical analysis 1200*b* (e.g. by energy dispersive X-ray spectroscopy) illustrating an intensity parameter 1205 representing the amount of a chemical element in dependency of an identification parameter 1201 representing a sort of the chemical element (e.g. an energy absorbed by the chemical element). The chemical analysis 1200*b* may represent an area of the processing region 316 before processing the substrate 102.

The material of the surface 102*s* (e.g. including or formed from copper) may be represented by a strong primary peak 1204*a* and secondary peak 1204*b* without presence of a peak 1304 representing material of the protection layer 108 (e.g. the base material (e.g. the viscous material 104 or the non-viscous material 106 respectively). This indicates a contamination free processing region 316.

Figure 13A:
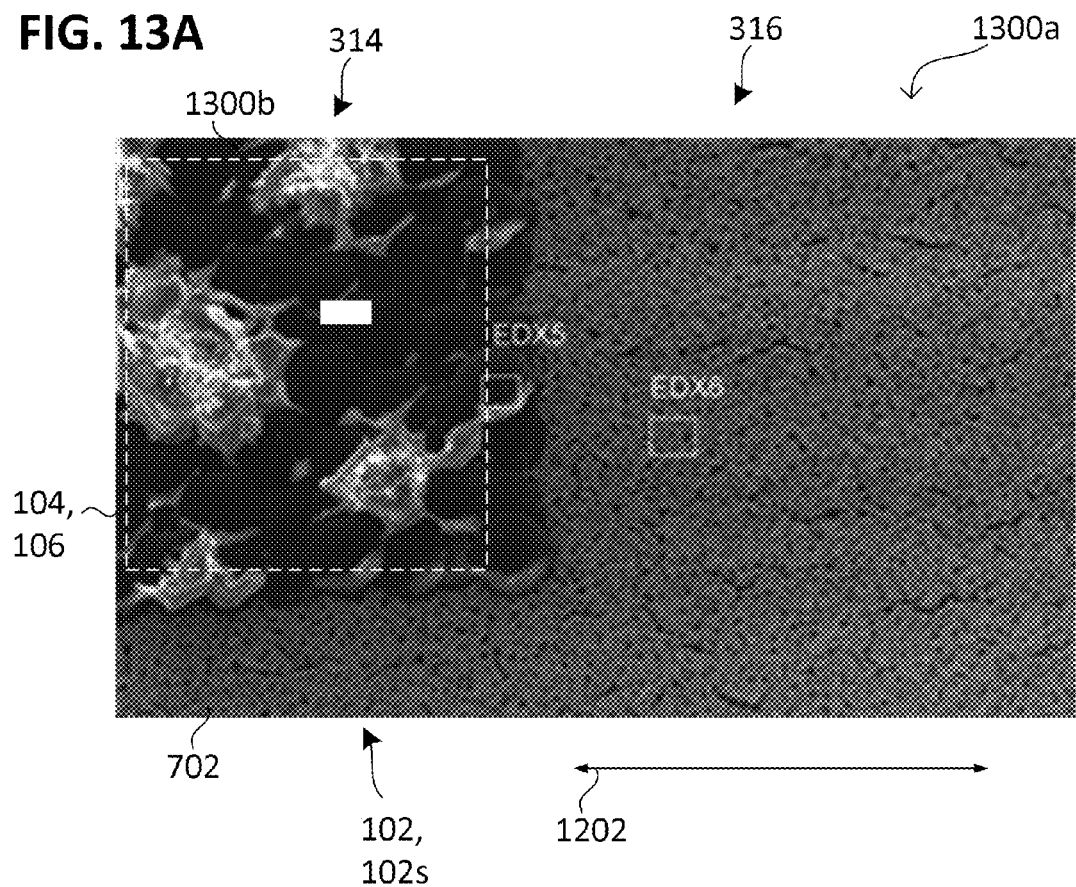
FIG. 13A and FIG. 13B respectively show a method according to various embodiments in a schematically top view.
Figure 13B:
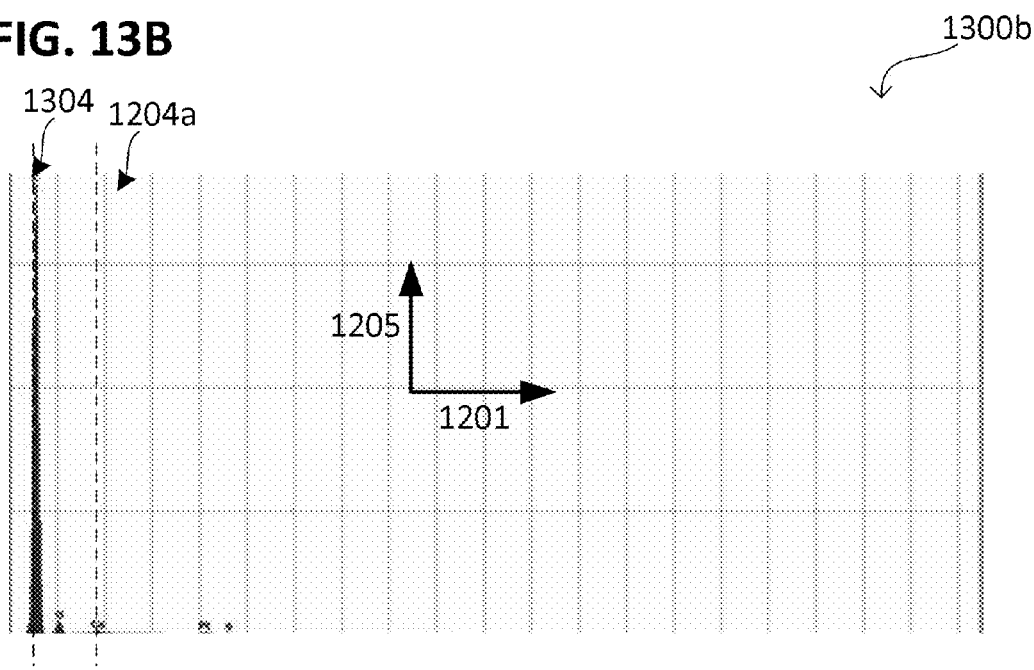

FIG. 13A and FIG. 13B respectively show a method according to various embodiments in a schematically top view.

The chemical analysis 1300*b* (e.g. by energy dispersive X-ray spectroscopy) represents an area of the non-processing region 314 before processing the substrate 102.

The material of the protection layer 108, e.g. the base material (e.g. the viscous material 104 or the non-viscous material 106 respectively), may be represented by a strong peak 1304. The strong peak 1304 may represent at least one of oxygen or carbon of the protection layer 108.

Figure 14A:
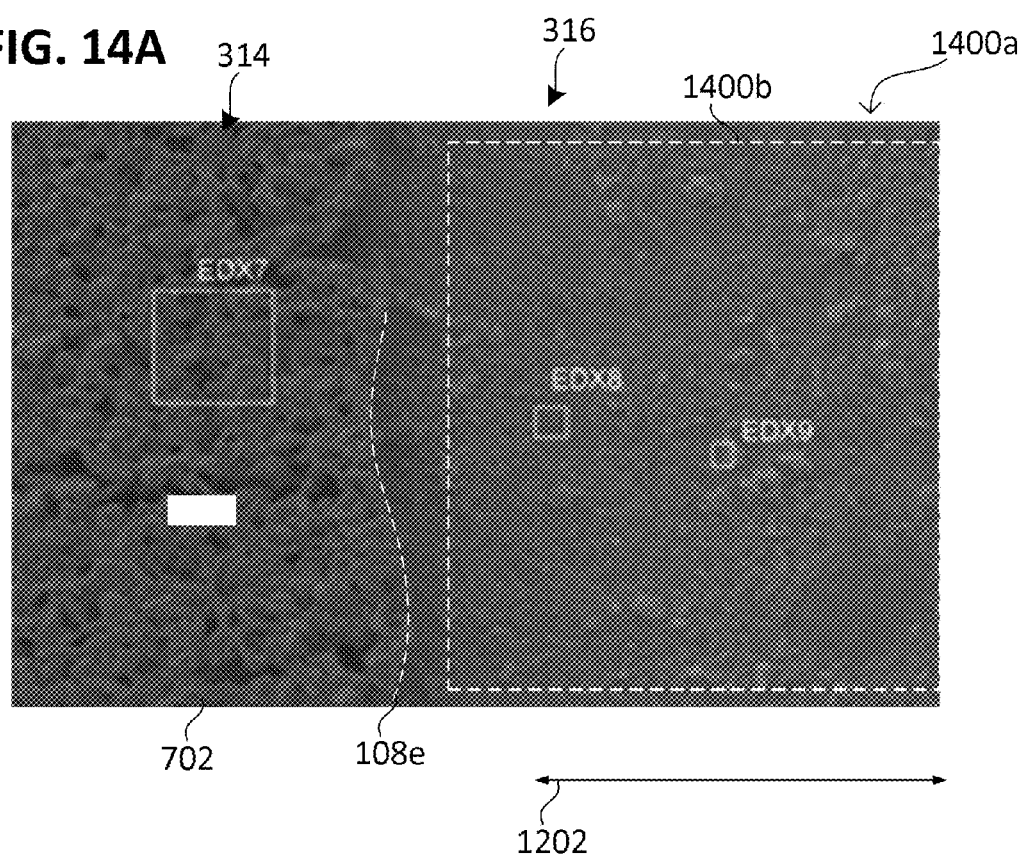
FIG. 14A and FIG. 14B respectively show a method according to various embodiments in a schematically top view.
Figure 14B:
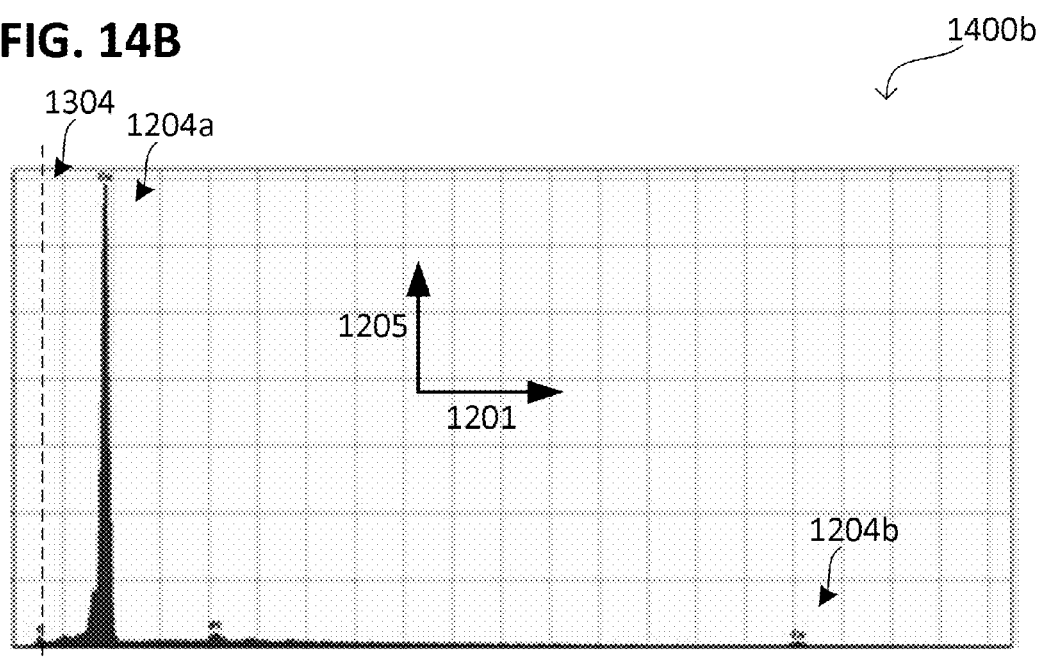

FIG. 14A and FIG. 14B respectively show a method according to various embodiments in a schematically top view.

The method may include in 1400*a* processing the substrate 102, e.g. the surface 102*s*, using the protection layer 108 as mask. For example, the substrate 102, e.g. the surface 102*s*, may be processed using etching. A length scale 1202 may be in the range from about 100 μm to about 500 μm, e.g. about 300 μm.

The chemical analysis 1400*b* (e.g. by energy dispersive X-ray spectroscopy) may be similar to the chemical analysis 1300*a* representing an area of the processing region 316 after processing the substrate 102. The material of the surface 102*s* (e.g. including or formed from copper) may be represented by a strong primary peak 1204*a* and secondary peak 1204*b* without presence of a peak 1304 representing material of the protection layer 108, e.g. the base material (e.g. the viscous material 104 or the non-viscous material 106 respectively). This indicates a contamination free processing region 316.

After processing the substrate 102, e.g. the porous structure 702, a rippled edge 108*e* (or rippled rim 108*e*) may remain from the usage of a viscous material 104 according to various embodiments, e.g. the hot-melt material, to form a mask. The rippled edge or rippled rim may result from the printing process, e.g. from the shape of the droplets. By reducing the droplet size (e.g. their volume), the amplitude of the rippled edge 108*e* or rippled rim 108*e* may be reduced. By analyzing the shape of the readily processed substrate 102, e.g. the readily processed porous structure 702, the usage of the method according to various embodiments may be revealed.

Figure 15A:
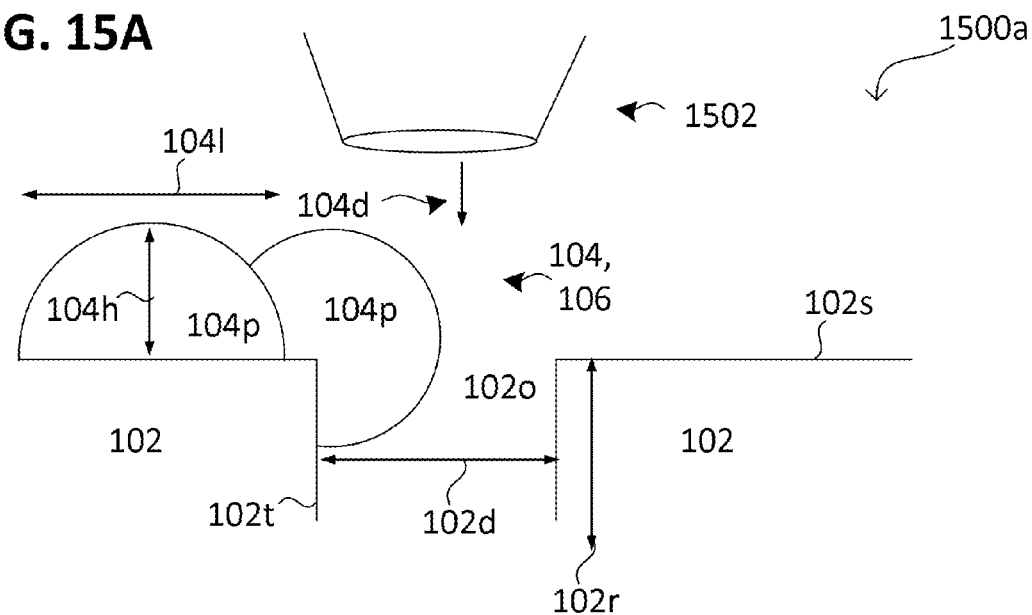
FIG. 15A and FIG. 15B respectively show a method according to various embodiments in a schematically side view or schematically cross sectional view.
Figure 15B:
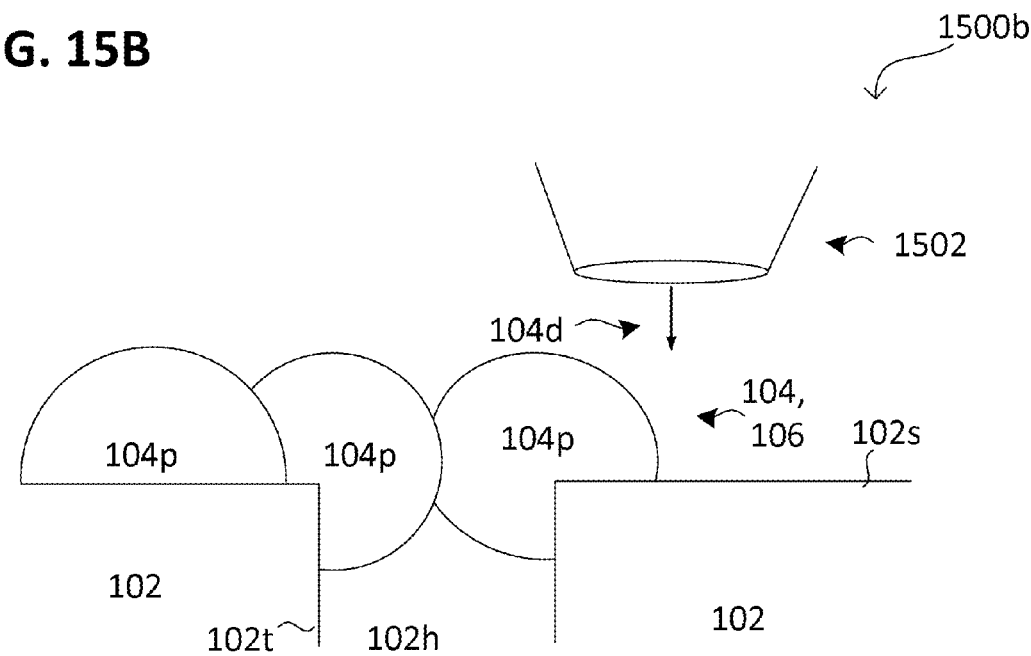

FIG. 15A and FIG. 15B respectively show a method according to various embodiments in a schematically side view or schematically cross sectional view.

The method may include in 1500*a* printing the base material (e.g. including or formed from the viscous state 104) on the substrate 102 including a topography feature 102*t*, e.g. a concave topography feature 102*t* (in other words, extending from the surface 102*s* into the substrate 102). In other words, the protection layer 108 may be formed using a printing process, e.g. an inkjet-printing process, e.g. a drop-on-demand (DOD) process, e.g. at least one of a thermal DOD or a piezoelectric DOD.

According to various embodiments, a plurality of portions 104*p* of the base material (e.g. including or formed from the viscous state 104) may be disposed sequentially. For example, the base material may be disposed drop-per-drop, e.g. a plurality of drops 104*p* may be disposed sequentially. Alternatively or additionally, the base material may be disposed line-per-line, e.g. e.g. a plurality of lines 104*p* (illustrated in a cross sectional view) may be disposed sequentially. For example, each line may include at least one of: more than one drop 104*p* including or formed from the base material (e.g. including or formed from the viscous state 104) or a line including or formed from the base material (e.g. elongated).

The printing device may include a nozzle 1502 including at least one actuator, e.g. a piezoelectric actuator, which forms portion 104*p* of the base material (e.g. including or formed from the viscous state 104), e.g. in form of a plurality of droplets 104*p* (a plurality of drops), e.g. which may sequentially be brought into contact with the substrate 102, e.g. the surface 102*s*, e.g. separated by at least one of time or distance.

The base material (e.g. including or formed from the viscous state 104) may include or be formed from at least one of: a light-curable material (e.g. an UV-curable material); or a hot-melt material. Using the printing process, e.g. the inkjet-printing process, the base material (e.g. as viscous material 104, e.g. the light-curable material and/or the hot-melt material) may be disposed over the substrate 102, e.g. the porous structure 702.

The base material (e.g. including or formed from the viscous state 104) may be disposed over the substrate 102 according to a predetermined spatial distribution. The spatial distribution may include or be formed from at least one of: a position of each portion (e.g. at least one of a drop or a line) of the plurality of portions 104*p* (e.g. in which the each portion of the plurality of portions 104*p* contacts the substrate 102); an amount of material per area of the surface 102*s*; a portion density; amount of lines per area on the substrate 102 (line density); an amount of material per portion (e.g. at least one of a drop or a line) of the plurality of portions 104*p*.

According to various embodiments, a volume of each portion (portion volume) of the plurality of portions 104*p* (e.g. drops) may be in the range from about 10 picoliters (pL) to about 100 pL, e.g. in the range from about 10 pL to about 80 pL, e.g. in the range from about 20 pL to about 50 pL, e.g. in the range from about 20 pL to about 40 pL, e.g. about 30 pL.

According to various embodiments, the base material (e.g. including or formed from the viscous state 104), e.g. each portion of the plurality of portions 104*p*, may be transformed into the non-viscous state 106 (e.g. solidified or cured) directly after contacting the substrate 102, e.g. the surface 102*s*. Transforming the base material into a non-viscous state 106 may include adjusting the viscosity of the base material. The faster the base material, e.g. each portion of the plurality of portions 104*p*, may be transformed into the non-viscous state 106, the less base material may seek into the at least one topography feature 102*t*, e.g. into the porous structure 702. This may stabilize the spatial distribution of the base material, e.g. a position of each portion of the plurality of portions 104*p*. According to various embodiments, the surface 102 may be sealed by the protection layer 108 formed from the base material (e.g. including or formed from the non-viscous state 106).

According to various embodiments, e.g. if the base material includes or is formed from a hot-melt material, the printing device may include a reservoir in which the base material may be heated to a temperature greater than its viscosity-transition temperature, e.g. greater than its melting temperature, to transform the base material into the viscous state 104. A contact temperature, e.g. defined by a temperature of at least one of the surface 102*s*, the substrate 102, or the porous structure 702, may be less than the viscosity-transition temperature of the base material. By adjusting the contact temperature at least one of the following may be adjusted: a structural accuracy, a texture of the protection layer 108 (e.g. the printed image), a surface topography of the protection layer 108.

According to various embodiments, the method may in 1500*a* include adjusting the viscosity of the base material (e.g. including or formed from the viscous state 104), e.g. by at least one of curing or solidification, such that the base material is substantially not flowing into the at least one topography feature 102*t*. For example, the base material (e.g. including or formed from the viscous state 104) may be transformed into the non-viscous state 106 by adjusting the viscosity of the base material after the base material contacts the substrate 102. Alternatively or additionally, the base material (e.g. including or formed from the viscous state 104) may be transformed into the non-viscous state 106 by adjusting the viscosity of the base material before the base material is displaced from a position in which the base material (e.g. each portion of the plurality of portions 104*p*) contacts the substrate 102.

According to various embodiments, the base material (e.g. each portion of the plurality of portions 104*p*) may be transformed into the non-viscous state 106 (e.g. by at least one of curing or solidification), e.g. at least one of a solid state or a cured state, before flowing into the at least one topography feature 102*t*. Alternatively or additionally, the base material may be transformed into the non-viscous state 106 before the base material is displaced from a position in which the base material (e.g. each drop 104*p* or each line 104*p*) contacts the substrate 102.

Therefore, a position of the base material (e.g. including or formed from the viscous state 104) in which the base material (e.g. each portion of the plurality of portions 104*p*) contacts the surface 102*s* is maintained by adjusting the viscosity of the base material.

The at least one topography feature 102*t* may include or be formed from a microscopic opening, e.g. the at least one topography feature 102*t* (e.g. its opening 102*o*) may have an extension less than about 1 mm, e.g. less than about 0.1 mm, e.g. less than about 10 μm, e.g. less than about 1 μm, e.g. less than about 0.1 μm.

According to various embodiments, the at least one topography feature 102*t* may include an extension 102*d* (parallel to the surface 102*s*) less than an extension (parallel thereto) of each portion 104*p* of the base material (e.g. including or formed from the viscous state 104), e.g. parallel to the surface 102*s* (lateral extension 104*l* of the portion 104*p* of the base material) and/or perpendicular to the surface 102*s* (a thickness 104*h* of the portion 104*p* of the base material). Alternatively or additionally, the at least one topography feature 102*t* (e.g. its opening 102*o*) may include an extension 102*d* less than an extension 102*r* of the at least one topography feature 102*t* into the substrate 102 (depth 102*r* of the at least one topography feature 102*t*).

Alternatively or additionally, the at least one topography feature 102*t* may include a volume less than a volume of each portion 104*p* of the base material (e.g. a drop or a line). The lateral extension 104*l* of a portion 104*p* of the base material (e.g. including or formed from the viscous state 104) may correspond to a lateral extension of the contact region 314 (the portion 104*p* of the base material contacting the substrate 102). The thickness 104*h* of a portion 104*p* of the base material may be equal or less than a thickness of the protection layer 108.

According to various embodiments, the method may include in 1500*b* covering the at least one topography feature 102*t* with base material. Since the base material (e.g. including or formed from the non-viscous state 106) material may substantially not flow into the at least one topography feature 102*t*, a hollow 102*h* may be formed at least one of: in the substrate 102; between the substrate 102 and the base material (e.g. including or formed from the non-viscous state 106); between the substrate 102 and the protection layer 108.

Figure 16A:
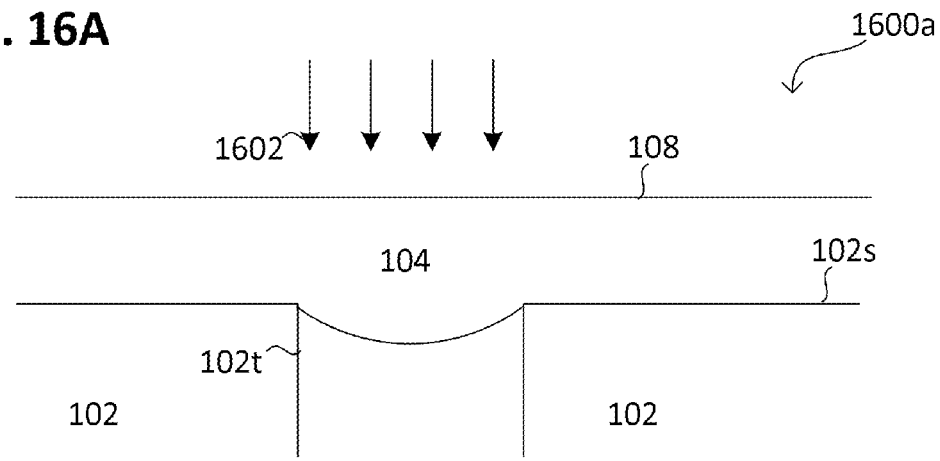
FIG. 16A and FIG. 16B respectively show a method according to various embodiments in a schematically side view or schematically cross sectional view.
Figure 16B:
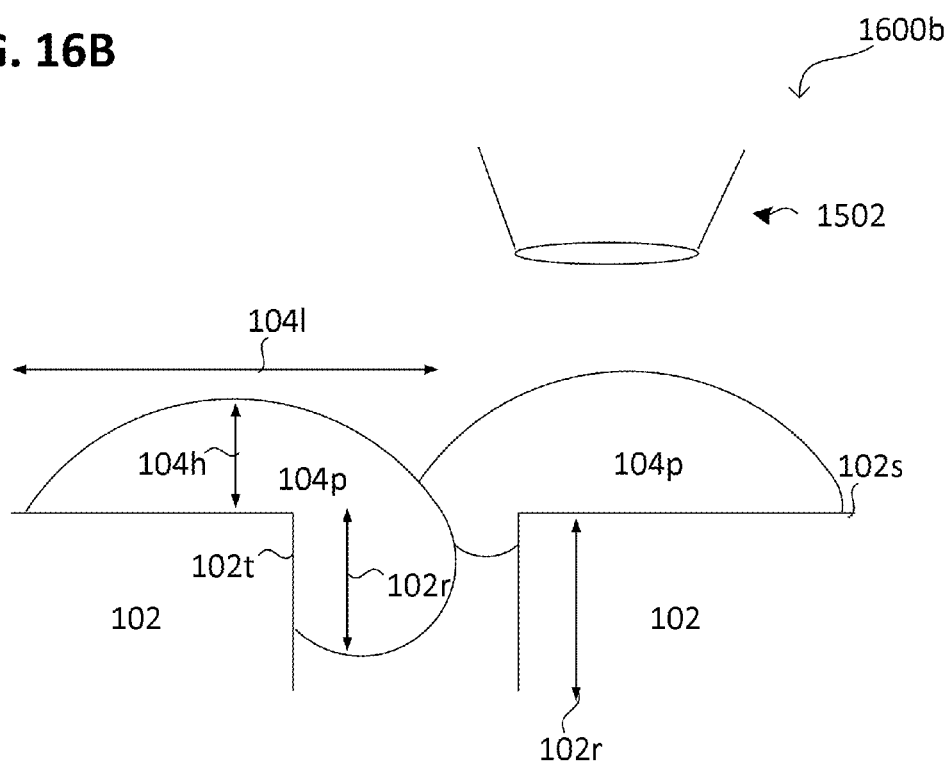

FIG. 16A and FIG. 16B respectively show a method according to various embodiments in a schematically side view or schematically cross sectional view.

According to various embodiments, the method may include in 1600*a* adjusting 1602 the base material (e.g. including or formed from the viscous state 104) such that the protection layer 108 covers the at least one topography feature 102*t*.

According to various embodiments, the method may include in 1600*b* adjusting 1602 the base material (e.g. including or formed from the viscous state 104) such that the base material forms a closed protection layer 108. For example, the portions 104*p* of the base material (e.g. including or formed from the viscous state 104) may be deformed during a contacting period, e.g. illustratively diffluence. The contacting period may be configured such, that adjacent portions 104*p* of the base material (e.g. including or formed from the viscous state 104) may contact each other. This may result in an increased amount of the base material flowing into the at least one topography feature 102*t*. The adjusting 1602 may be configured such that an extension 104*r* of the base material (e.g. including or formed from the viscous state 104) into the at least one topography feature 102*t* is less than at least one of: an extension (parallel thereto) of each portion 104*p* of the base material (e.g. a drop or a line), e.g. parallel to the surface 102*s* (lateral extension 104*l*) and/or perpendicular to the surface 102*s* (a thickness 104*h*); an extension 102*r* of the at least one topography feature 102*t* into the substrate 102 (depth 102*r*). The lateral extension 104*l* of a portion 104*p* of the base material (e.g. including or formed from the viscous state 104) may correspond to a lateral extension of the contact region 314 (the portion 104*p* of the base material (e.g. including or formed from the viscous state 104) contacting the substrate 102). The height 104*h* of a portion 104*p* of the base material (e.g. including or formed from the viscous state 104) may be equal or less than a thickness of the protection layer 108.

Figure 17A:
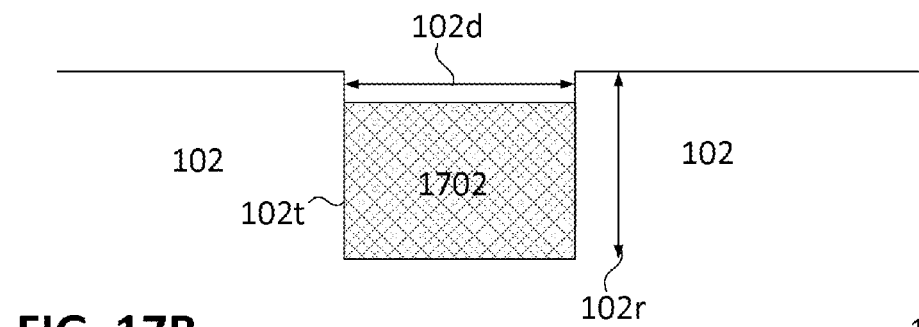
FIG. 17A to FIG. 17C respectively show a method according to various embodiments in a schematically side view or schematically cross sectional view.
Figure 17B:
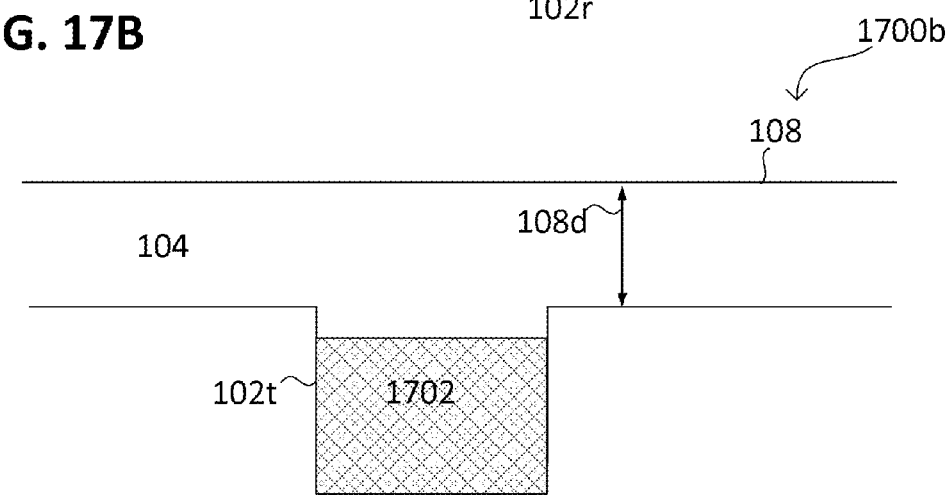
Figure 17C:
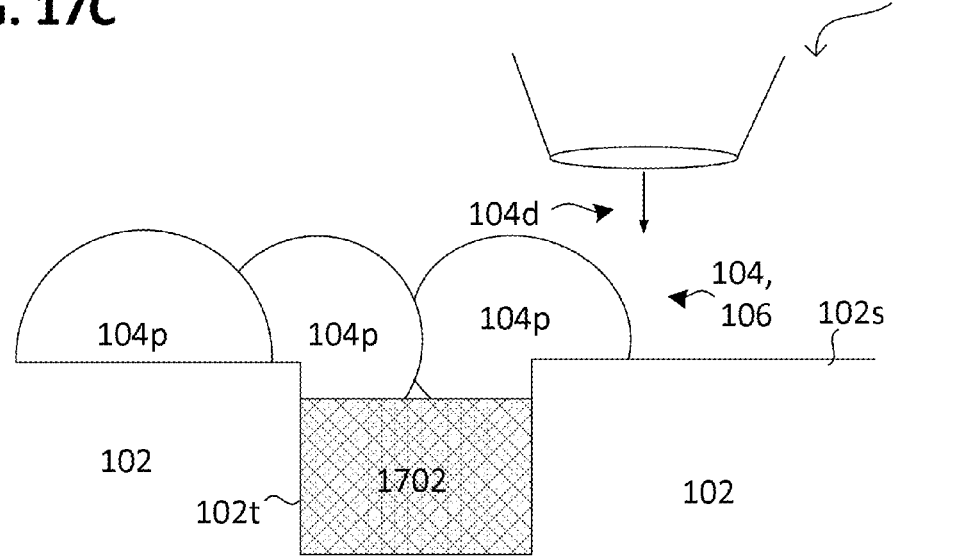
Figure 20A:
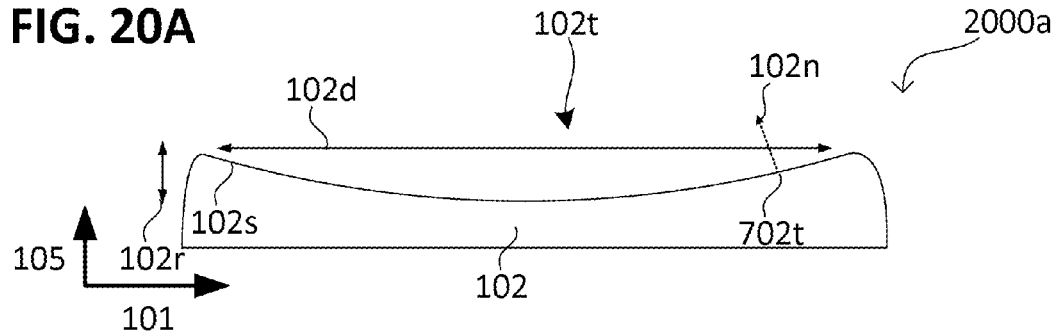
FIG. 20A to FIG. 20D respectively show a method according to various embodiments in a schematically side view or schematically cross sectional view.
Figure 20B:
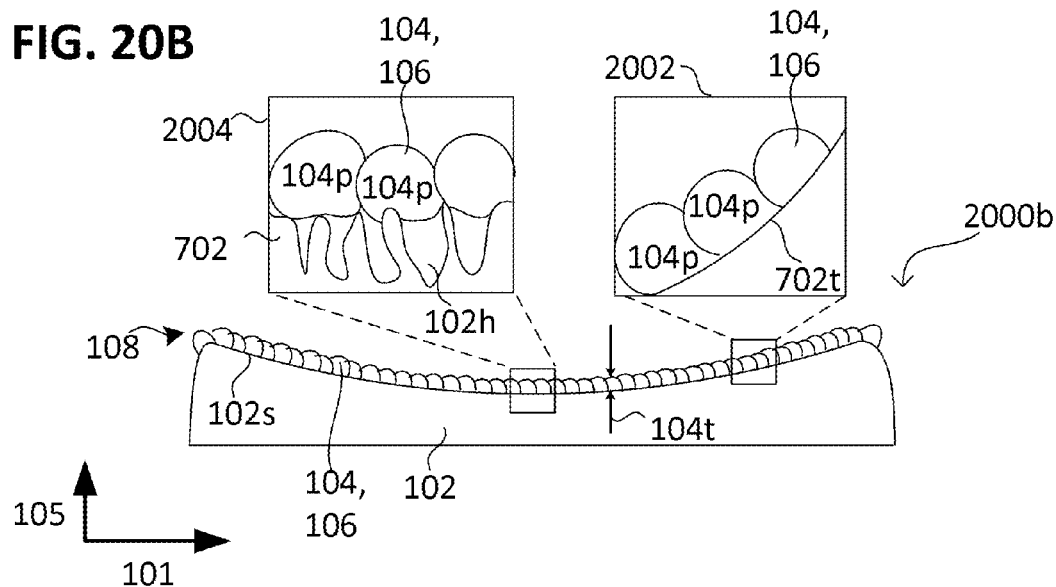
Figure 20C:
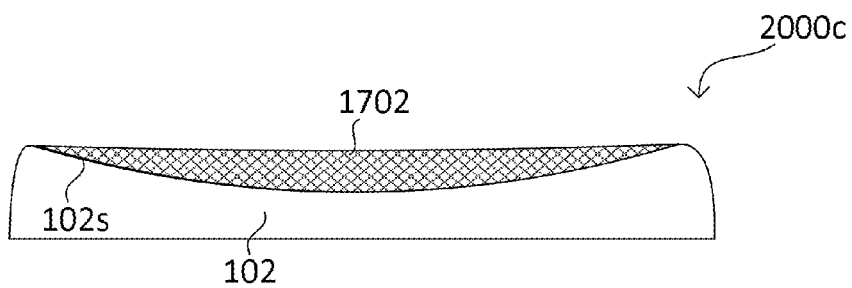
Figure 20D:
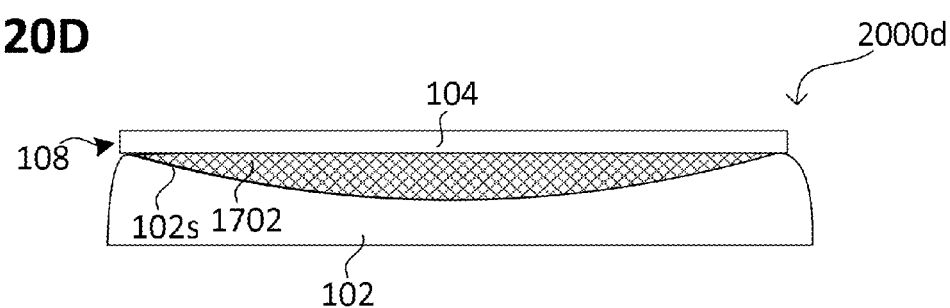

FIG. 17A, FIG. 17B and FIG. 17C respectively show a method according to various embodiments in a schematically side view or schematically cross sectional view.

The method may include in 1700*a* at least partially filling at least one topography feature extending into a substrate 102 with a sacrificial material 1702.

According to various embodiments, the at least one topography feature 102t (e.g. the volume of the porous structure 702) may be filled more than about 50%, e.g. more than about 60%, e.g. more than about 70%, e.g. more than about 80%, e.g. more than about 90%, e.g. more than about 99%.

According to various embodiments, the at least one topography feature 102t (e.g. its opening 102o) may include an extension 102d (parallel to the surface 102s) less than an extension 102r of the at least one topography feature 102t into the substrate 102 (depth 102r of the at least one topography feature 102t).

The method may include in 1700b disposing a base material (e.g. including or formed from the viscous state 104) over the sacrificial material 1702 to form a protection layer over the at least one topography feature 102t. The sacrificial material 1702 may be disposed in the substrate 102.

According to various embodiments, at least one of: the extension 102d of the opening of the at least one topography feature 102t or the depth 102r of the at least one topography feature 102t may be less than an extension of the protection layer 108 perpendicular to the surface 102s (a thickness 108d of the protection layer 108).

The method may include in 1700c disposing a plurality of portions 104p including or formed from the base material (e.g. including or formed from the viscous state 104) over the sacrificial material 1702 to form a protection layer over the at least one topography feature 102t. Alternatively or additionally, the protection layer 108 may include or be formed from other suitable materials (if the sacrificial material 1702 is used).

FIG. 18A to FIG. 18D respectively illustrate a method according to various embodiments in a schematically side view or schematically cross sectional view.

According to various embodiments, the method may include in 1800a providing a substrate 102 including or formed from a porous structure 702 similar to the method in 800a.

The method may include in 1800b at least partially filling the porous structure 702, e.g. the at least one topography feature 102t, with the sacrificial material 1702. The sacrificial material 1702 may extend at least one of into or through the porous structure 702.

According to various embodiments, the method may in 1800c include forming a protection layer 108 over at least one of the sacrificial material 1702 or the porous structure 702. The at least one hollow 102 may be filled with the sacrificial material 1702.

The protection layer 108 may be formed over the substrate 102 (e.g. the surface 102s), e.g. the porous structure 702, e.g. by disposing a base material (e.g. including or formed from the viscous state 104) over the substrate 102.

The method may optionally include in 800b transforming the base material (e.g. including or formed from the viscous state 104) into a non-viscous material 106, e.g. before structuring 802 the protection layer 108. The base material (e.g. including or formed from the viscous state 104) may be transformed into a non-viscous state (e.g. by at least one of curing or solidification), e.g. at least one of a solid state or a cured state, after the protection layer 108 is formed.

A thickness 108d of the protection layer may be greater than the maximum height variation 702h, e.g. in the region of the maximum height variation 702h. Alternatively or additionally, the thickness 108d of the protection layer 108 may be greater than about 2 µm, e.g. greater than about 4 µm, e.g. greater than about 6 µm, e.g. greater than about 8 µm, e.g. greater than about 10 µm.

The at least one topography feature 102t, e.g. the pores underlying the protection layer 108 may include a volume which is smaller than a volume of the protection layer 108. In other words, the protection layer 108 may cover the at least one topography feature 102t without filling the at least one topography feature 102t.

Optionally, the method may include in 1800d structuring 802 the protection layer 108 using photolithography, e.g. before processing the surface. The protection layer 108 may be structured according to a predetermined pattern (e.g. a mask pattern).

FIG. 19A to FIG. 19D respectively illustrate a method according to various embodiments in a schematically side view or schematically cross sectional view.

After structuring 802 the protection layer 108 in 1800d, at least one processing region 316 of the substrate 102 (e.g. the surface 102s) may be exposed (in other words, uncovered). Alternatively or additionally, the sacrificial material 1702 may be exposed over the at least one processing region 316 of the substrate 102.

Alternatively or additionally, to 1800d, the method may include in 1900a disposing the base material (e.g. including or formed from the viscous state 104) according to a predetermined pattern (e.g. a mask pattern). The predetermined pattern may be configured to leave at least one region 316 of the substrate 102 (e.g. the surface 102s) and/or the sacrificial material 1702 over the at least one region 316 uncovered. In this case, the method may optionally include in 1900a structuring 802 the protection layer 108 using photolithography, e.g. before processing the surface 102s. This may increase the structural accuracy of the protection layer 108. Alternatively or additionally, the method may optionally include in 1900a structuring 802 the sacrificial material 1702, e.g. before processing the surface 102s, to fully expose the at least one processing region 316.

The method may include in 1900b processing the substrate 102, e.g. the surface 102s. The at least one processing region 316 may be processed, e.g. by wet etching (e.g. using a liquid etchant) or dry etching (e.g. using at least one of a gaseous etchant; a plasma etchant; or an ion etchant). For example, at least one trench 902 or recess 902 may be formed in the substrate 102, e.g. in the porous structure 702. The processing the substrate 102 may be configured to remove the sacrificial material 1702 at least one of in or over the processing region 316.

The method may include in 1900c removing the protection layer 108, e.g. using a first solvent (e.g. an alkaline fluid, an organic fluid, or a water based fluid), e.g. a heated first solvent. The heated first solvent may include a temperature greater than a temperature of the protection layer 108, e.g. greater than a viscosity-transition temperature of the protection layer 108 (e.g. the base material). Alternatively or additionally, the protection layer 108 may be heated during removing the protection layer 108, e.g. if the protection layer 108 includes or is formed from a hot-melt material (e.g. a thermoplastic).

The method may include in 1900d removing the sacrificial material 1702, e.g. using a second solvent (e.g. a non-organic solvent), e.g. a protic solvent, e.g. water. A solubility of the sacrificial material 1702 in the second solvent may be greater than a solubility of the base material (e.g. including or formed from the viscous state 104) in the second solvent.

According to various embodiments, the first solvent is different from the second solvent. In this case, the protection layer 108 and the sacrificial material 1702 may be removed in a two-step process, including in first step removing the protection layer 108 using the first solvent and in a second step removing the sacrificial material 1702 using the second solvent. The protection layer 108 may be removed using at least one of the first solvent having a greater temperature than the protection layer 108 or heating the protection layer 108. The second solvent may differ from the first solvent in at least one of: a temperature, a chemical composition.

Alternatively, the first solvent and the second solvent may be mixed together to form a solvent mixture which may remove the sacrificial material 1702 and the protection layer 108 together, e.g. in a single step.

Alternatively, the first solvent and the second solvent may be equal (e.g. water). Then the sacrificial material 1702 and the protection layer 108 may be removed together, e.g. by heating the solvent. For example, the second solvent and the first solvent may be equal in their temperature and their chemical composition.

The method may include in 1900$d$ exposing at least the contact region 314.

FIG. 20A to FIG. 20D respectively illustrates a method according to various embodiments in a schematically side view or schematically cross sectional view.

According to various embodiments, the method may include in 2000$a$ providing a substrate 102 including at least one macroscopic topography feature 102$t$. In other words, the substrate 102, e.g. its surface 102$s$, may include a macroscopic deviation from a planar plane. For example, the surface 102$s$ may include a concave shape.

According to various embodiments, a first extension 102$r$ of the at least one macroscopic topography feature 102$t$ into the substrate 102 (depth 102$r$ of the at least one topography feature 102$t$) may be greater than a second extension 102$d$ (perpendicular to the first extension 102$r$) of the at least one macroscopic topography feature 102$t$ (e.g. its opening). According to various embodiments, the second extension 102$d$ of the at least one macroscopic topography feature 102$t$ may be greater than at least one of: a thickness of the at least one surface layer, or a thickness of the substrate (e.g. a wafer), a thickness of the protection layer 108. Alternatively or additionally, the second extension 102$d$ of the at least one macroscopic topography feature 102$t$ may be greater than about 1 mm, e.g. greater than about 5 mm, e.g. greater than about 1 cm, e.g. greater than about 10 cm, e.g. greater than about 1 m.

According to various embodiments, the first extension 102$t$ of the at least one macroscopic topography feature 102$t$ may be smaller than at least one of: a thickness of the at least one surface layer, or a thickness of the substrate (e.g. a wafer), a thickness of the protection layer 108. Alternatively or additionally, the first extension 102$t$ of the at least one macroscopic topography feature 102$t$ may be less than about 1 mm, e.g. less than about 0.1 mm, e.g. less than about 10 μm, e.g. less than about 1 μm, e.g. less than about 0.1 μm.

According to various embodiments, an aspect ratio of the macroscopic topography feature 102$t$ (ratio of the second extension 102$d$ to the first extension 102$t$) may be greater than about 1, e.g. greater than about 10, e.g. greater than about $10^2$, e.g. greater than about $10^3$, e.g. greater than about $10^4$, e.g. greater than about $10^5$.

According to various embodiments, the substrate 102 (e.g. the surface 102$s$), e.g. the at least one macroscopic topography feature 102$t$, may include a surface portion 702$t$ having a surface normal 102$n$ which is tilted regarding a gravitational force direction (e.g. direction 105) as illustrated in the detailed view 2002.

Optionally, the substrate may include or be formed from a porous structure 702 providing the surface 102$s$ as illustrated in the detailed view 2004, e.g. similar to FIG. 8A.

According to various embodiments, the method may include in 2400$b$ disposing a base material (e.g. including or formed from the viscous state 104) over the substrate 102. The viscous material 104 may be configured similar, as described before, e.g. similar to 400$a$ to 400$d$.

The base material (e.g. including or formed from the viscous state 104) may be distributed at least one of over or in the at least one macroscopic topography feature 102$t$ according to a predetermined spatial distribution (e.g. at least one of a spatial material distribution or a spatial coverage distribution), e.g. which defines at least one of: an amount of the base material (e.g. including or formed from the viscous state 104) disposed 104$d$ in regions of the substrate 102; or one or more regions of the substrate 102 which are designated to be covered by the base material (e.g. including or formed from the viscous state 104).

The base material (e.g. including or formed from the viscous state 104) may be disposed 104$d$ using a disposing device, e.g. a printer, which is configured to distribute the base material (e.g. including or formed from the viscous state 104) according to the predetermined spatial distribution. The base material (e.g. including or formed from the viscous state 104) may be disposed 104$d$ sequentially, for example, by disposing 104$d$ a plurality of portions of the base material (e.g. including or formed from the viscous state 104) separated by at least one of: spatial distance, or a time distance (in other words, separated by a time period), e.g. by at least one of dropping, or spraying the base material (e.g. including or formed from the viscous state 104) onto the substrate 102. Alternatively or additionally, the base material (e.g. including or formed from the viscous state 104) may be disposed 104$d$ continuously, e.g. be a continuous flow of the base material (e.g. including or formed from the viscous state 104) onto the substrate 102.

According to various embodiments, the base material (e.g. including or formed from the viscous state 104) may be heated prior to disposing 104$d$ the base material (e.g. including or formed from the viscous state 104) over the substrate 102, e.g. prior to contacting the substrate 102. Heating the base material (e.g. including or formed from the viscous state 104) prior to disposing 104$d$ the base material (e.g. including or formed from the viscous state 104) over the substrate 102 may configured such that a temperature of the base material (e.g. including or formed from the viscous state 104) before contacting the substrate 120 is greater than the viscosity-transition temperature, e.g. greater than the melting temperature of the base material.

According to various embodiments, the substrate 102 may include the surface 102$s$, which is contacted by the base material (e.g. including or formed from the viscous state 104). For example, the surface 102$s$ may be a surface of a semiconductor region of the substrate 102 or a metal region of the substrate 102. Optionally, at least one layer (e.g. including or formed from a contact pad) may be formed at least one of in or over the semiconductor region of the substrate 102. In this case, the at least one layer (also referred to as at least one surface layer) may include the surface 102$s$. For example, the at least one surface layer may include or be formed from at least one metal layer, e.g. a porous metal layer. Alternatively, the substrate or the at least one surface layer may include or be formed from other materials, e.g. a porous other materials.

According to various embodiments, the substrate 102 (e.g. the surface 102$s$ of substrate), e.g. the at least one surface layer (e.g. the surface 102 of the at least one surface layer), may include or be formed from at least one of: a metal, a semiconductor (also referred to as semiconductor material), for example, an oxide including at least one of the metal or the semiconductor (semiconductor oxide or metal oxide respectively), e.g. silicon oxide, a nitride including at least one of the metal or the semiconductor (semiconductor nitride or metal nitride respectively), e.g. silicon nitride, or a dielectric material including at least one of the metal or the semiconductor (semiconductor dielectric or metal dielectric respectively).

According to various embodiments, the surface 102s, e.g. the substrate 102, e.g. the at least one surface layer, may include or be formed from copper.

The method may in 2400b include adjusting a viscosity of the base material (e.g. including or formed from the viscous state 104) as described before.

According to various embodiments, the method may include in 400b adjusting the viscosity of the base material (e.g. including or formed from the viscous state 104) during the base material is deformed on the substrate 102. The deformation of the base material (e.g. including or formed from the viscous state 104) may be induced by at least one of a gravity force, or a surface tension. Adjusting the viscosity of the base material (e.g. including or formed from the viscous state 104) may at least one of decelerate or stop the deformation of the base material (e.g. including or formed from the viscous state 104).

Adjusting the viscosity of the base material (e.g. including or formed from the viscous state 104) may be configured to stabilize an arrangement of the base material (e.g. including or formed from the viscous state 104), the arrangement including at least one of: a position of the base material (e.g. as viscous material 104, e.g. a position of each portion 104p of the base material) or a spatial distribution of the base material, e.g. as disposed 104d. At least one of the position of the base material (e.g. including or formed from the viscous state 104) or the spatial distribution of the base material (e.g. including or formed from the viscous state 104) may be defined by the region in which the base material (e.g. including or formed from the viscous state 104) contacts the substrate 102. In other words, at least one of the position or the spatial distribution of the base material (e.g. including or formed from the viscous state 104) relative to the substrate 102, e.g. to the contact region 314, may be maintained.

According to various embodiments, adjusting the viscosity of the base material (e.g. including or formed from the viscous state 104) may be configured to substantially line the at least one macroscopic topography feature 102t with the base material (e.g. including or formed from the viscous state 104).

Adjusting the viscosity may transform the base material (e.g. including or formed from the viscous state 104) into a non-viscous state 106 (e.g. including or formed from at least one of a solid state or a cured state), e.g. by at least one of curing the base material or solidifying the base material. After adjusting, the base material may be in the non-viscous state 106 (to form a protection layer). For example, the non-viscous state 106 includes or is formed from a hot-melt material in solid state and the base material includes or is formed from a hot-melt material in liquid state.

Adjusting the viscosity may be configured to adjust a thickness 104t of the base material (e.g. the protection layer formed therefrom). The thickness 104t of the base material may depend on the time period between the first contact (when deformation starts) of the base material (e.g. including or formed from the viscous state 104) with the substrate and the stabilization of the base material (e.g. including or formed from the viscous state 104), in other words, the time period (also referred to as contacting period) in which the base material (e.g. including or formed from the viscous state 104) may be deformable, e.g. by at least one of: the gravity force, or the surface tension. Illustratively, the thickness 104t of the base material (e.g. including or formed from the viscous state 104) may decrease with increasing contacting period. In other words, the faster the viscosity of the base material (e.g. including or formed from the viscous state 104) is increased, the less time the base material (e.g. including or formed from the viscous state 104) has to flow in all directions. Alternatively or additionally, the amount of the base material (e.g. including or formed from the viscous state 104) disposed 104d over the substrate 102 may be adjusted.

According to various embodiments, adjusting the thickness 104t of the base material (e.g. including or formed from the viscous state 104) may be further configured as described before.

According to various embodiments, the method may include in 2400b forming a protection layer 108. The protection layer 108 may include or be formed from the non-viscous material 106. The non-viscous material 106 may also include or be formed from an amorphous material.

The method may include in 2400b processing the substrate 102 using the protection layer 108 as mask. Processing the substrate 102 may include or be formed from at least one of: etching the substrate 102 (e.g. using at least one of: an gaseous etchant; a liquid etchant; a plasma etchant; or an ion etchant); doping the substrate 102 (e.g. using at least one of: a gaseous doping source; using a liquid doping source; or using a ion doping source, also referred to as ion implantation); depositing material over the substrate 102 (e.g. using at least one of: a gaseous deposition source; using a liquid deposition source; or using a plasma deposition source); or reacting the substrate 102 (e.g. using a gaseous reactant; using a liquid reactant; using a ion reactant).

The method may include in 2400b removing the protection layer 108 after processing the substrate 102.

According to various embodiments, a thickness 108d of the protection layer 108 may be less than the extension 102r of the at least one macroscopic topography feature 102t into the substrate 102.

According to various embodiments, the substrate 102, e.g. the porous structure 702, may include a surface portion having a surface normal, which is tilted regarding a gravitational force direction, wherein a position of the base material (e.g. including or formed from the viscous state 104) in which the base material (e.g. including or formed from the viscous state 104) contacts the surface portion is maintained by adjusting the viscosity of the base material (e.g. including or formed from the viscous state 104).

According to various embodiments, adjusting the viscosity of the base material (e.g. including or formed from the viscous state 104) may be configured such that the base material, e.g. a portion 104p of the base material, substantially does not flow into the topography feature after the base material (e.g. the portion 104p of the base material) contacts the substrate 102.

According to various embodiments, the method may include in 2000c at least partially filling the at least one macroscopic topography feature 102t extending into a substrate with a sacrificial material 1702, e.g. similar to 1700a.

According to various embodiments, the at least one macroscopic topography feature 102t (e.g. the volume of the porous structure 702) may be filled more than about 50%, e.g. more than about 60%, e.g. more than about 70%, e.g. more than about 80%, e.g. more than about 90%, e.g. more than about 99%.

According to various embodiments, the method may include in 2000d forming a protection layer 108 over the sacrificial material 1702. Optionally, the method may include in 2000d disposing the base material (e.g. including or formed from the viscous state 104) over the sacrificial material 1702 to form a protection layer 108 over the at least one macroscopic topography feature 102. Alternatively or additionally, the protection layer 108 may include or be formed from other suitable materials (if the sacrificial material 1702 is used).

Further, the method may include in 2000d processing the substrate using the protection layer 108 as mask and removing the protection layer 108 and the sacrificial material 1702 after processing the surface, as described before.

Figure 21:
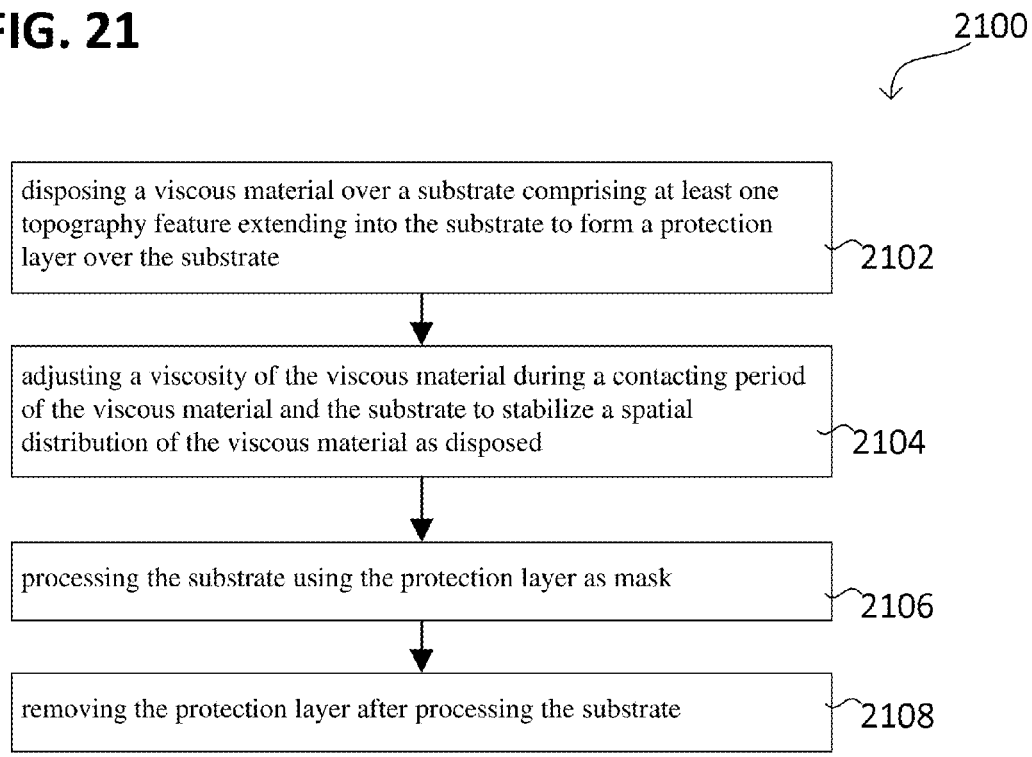
FIG. 21 shows a method according to various embodiments in a schematically flow diagram.

FIG. 21 illustrates a method 2100 according to various embodiments in a schematically flow diagram.

The method may include in 2102 disposing a viscous material over a substrate including at least one topography feature extending into the substrate to form a protection layer over the substrate; in 2104 adjusting a viscosity of the viscous material during a contacting period of the viscous material and the substrate to stabilize a spatial distribution of the viscous material as disposed; in 2106 processing the substrate using the protection layer as mask; and in 2108 removing the protection layer after processing the substrate.

Figure 22:
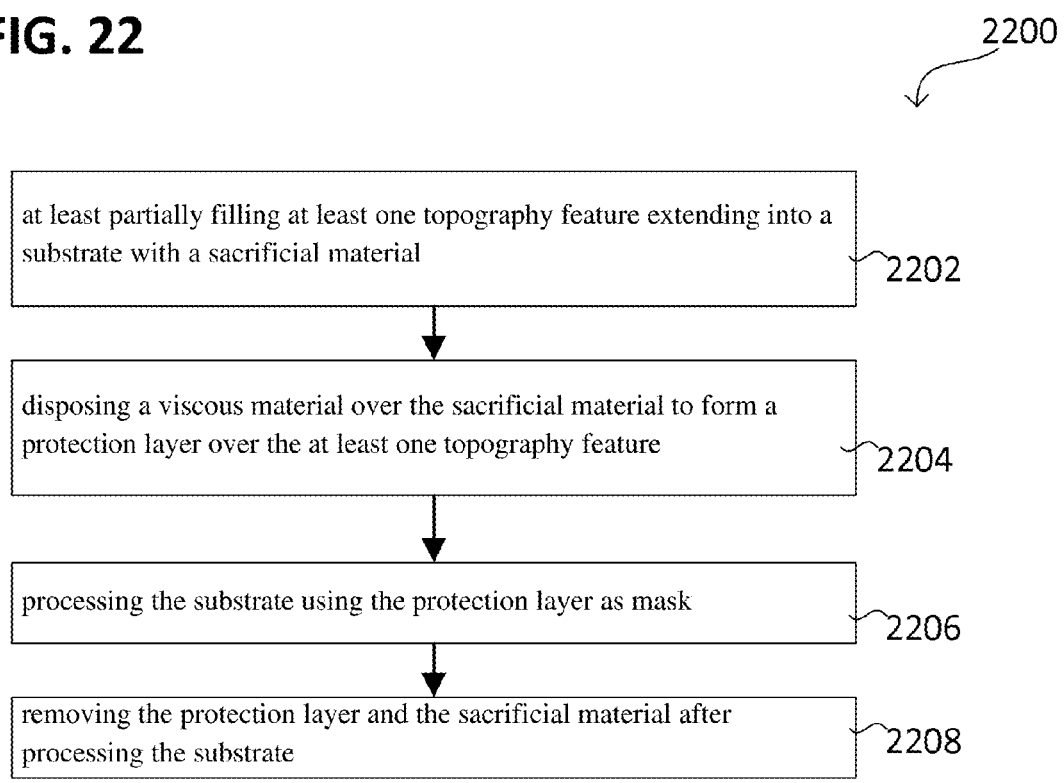
FIG. 22 shows a method according to various embodiments in a schematically flow diagram.

FIG. 22 illustrates a method 2000 according to various embodiments in a schematically side view or schematically cross sectional view.

The method may include in 2202 at least partially filling at least one topography feature extending into a substrate with a sacrificial material; in 2204 disposing a viscous material over the sacrificial material to form a protection layer over the at least one topography feature; in 2206 processing the substrate using the protection layer as mask; and in 2208 removing the protection layer and the sacrificial material after processing the substrate.

Figure 23A:
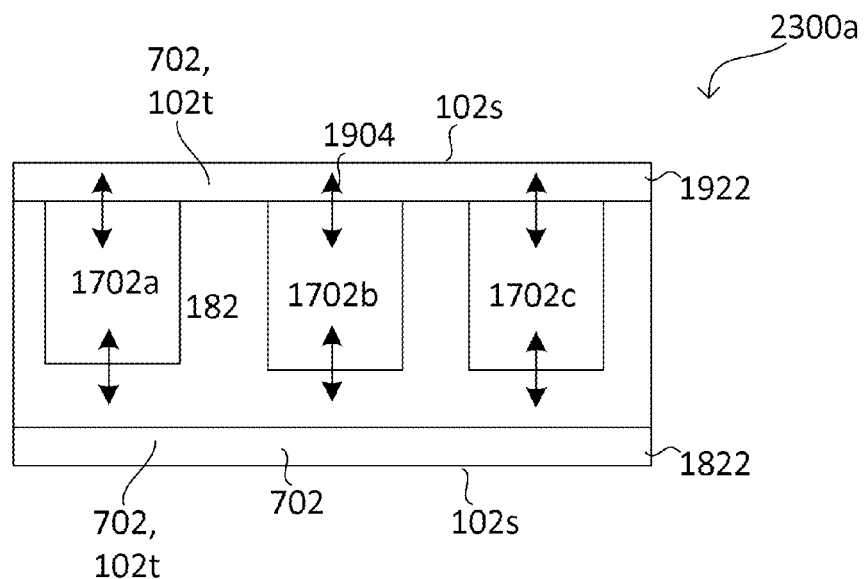
FIG. 23A and FIG. 23B respectively show a semiconductor device according to various embodiments in a method according to various embodiments in a schematic cross sectional view or side view.

FIG. 23A illustrates a semiconductor device 2300a according to various embodiments in a method according to various embodiments in a schematic cross sectional view or side view.

According to various embodiments, the semiconductor device 2300a may include a plurality of semiconductor circuit elements 1702a, 1702b, 1702c electrically connected 1904 in parallel to each other and in electrical contact to the surface 102.

The semiconductor device 1900a may include a first metallization 1902 on the first side 102t of the semiconductor region 182. Each semiconductor circuit element of the plurality of semiconductor circuit elements 1702a, 1702b, 1702c may be electrically connected 1904 to the first metallization 1922. The at least one second contact pad 1708 may be formed from the first metallization 1922.

According to various embodiments, each semiconductor circuit element of the plurality of semiconductor circuit elements 1702a, 1702b, 1702c may include or be formed from a diode structure or a transistor structure (also referred to as transistor cell).

According to various embodiments, the plurality of semiconductor circuit elements 1702a, 1702b, 1702c may be part of or form a power semiconductor circuit element.

Alternatively or additionally, the semiconductor device 1900a may include a second metallization 1822 on the second side 102b of the semiconductor region 182. Each semiconductor circuit element of the plurality of semiconductor circuit elements 1702a, 1702b, 1702c may be electrically connected 1904 to the second metallization 1822. The at least one first contact pad 1706 may be formed from the second metallization 1822.

The first metallization 1922 may include a surface 102s processed as described before. Alternatively or additionally, the second metallization 1822 may include a surface 102s processed as described before.

According to various embodiments, each semiconductor circuit element of the plurality of semiconductor circuit elements 1702a, 1702b, 1702c (e.g. the power semiconductor circuit element) may include or be formed from a vertical structure. A vertical structure may be understood as providing a current flow from the first side of the semiconductor region 182 to the second side 102b of the semiconductor region 182 or vice versa.

According to various embodiments, each semiconductor circuit element of the plurality of semiconductor circuit elements 1702a, 1702b, 1702c (e.g. the power semiconductor circuit element) may include at least one gate contact pad. The at least one gate contact pad may be provided by (e.g. formed from) at least one of (if present) the first metallization 1922.

According to various embodiments, each semiconductor circuit element of the plurality of semiconductor circuit elements 1702a, 1702b, 1702c (e.g. the power semiconductor circuit element) may include or be formed from a transistor (e.g. a power transistor).

Optionally, at least one of the first metallization 1922 or the second metallization 1822 may include the at least one topography feature 102t. Alternatively or additionally, at least one of the first metallization 1922 or the second metallization 1822 may include the at least one topography feature 102t may include or be formed from the porous structure 702.

Figure 23B:
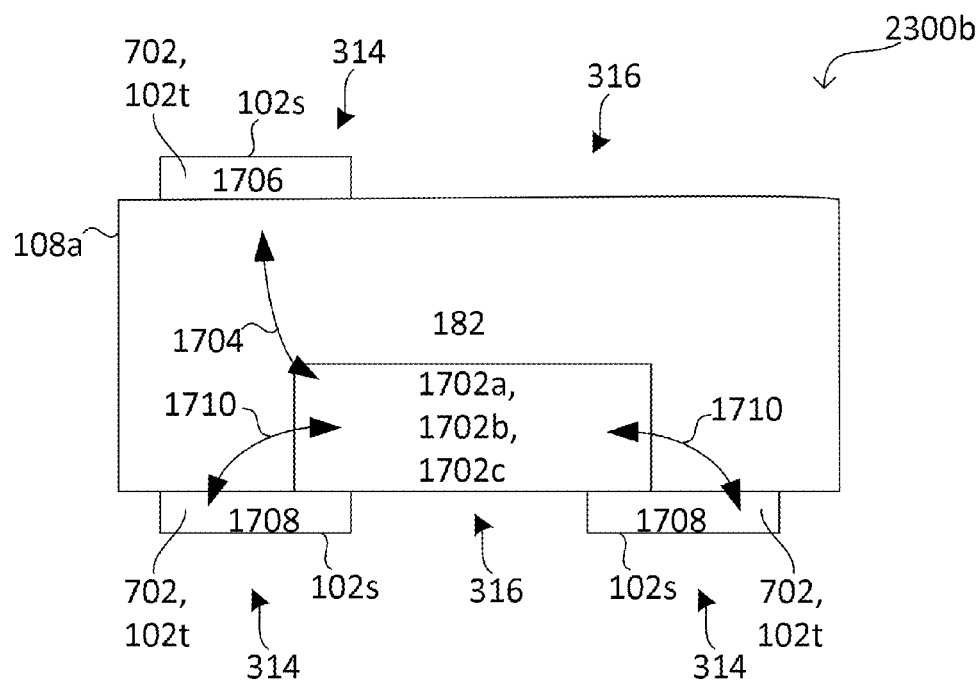

FIG. 23B illustrates a semiconductor device 2300b according to various embodiments in a method according to various embodiments in a schematic cross sectional view or side view.

The semiconductor device 2300b may include at least one a semiconductor circuit element 1702a, 1702b, 1702c, e.g. a power semiconductor circuit element 1702, formed at least one of over or in the semiconductor region. For example, the at least one semiconductor circuit element 1702a, 1702b, 1702c may include or be formed from at least one transistor (in other words, one or more transistors) in electrical contact 1704 to the surface 102.

According to various embodiments, the semiconductor device 1700a may include at least one first contact pad 1706 (e.g. at least one collector contact pad 1706). The at least one first contact pad 1706 may be electrically connected to the at least one semiconductor circuit element 1702a, 1702b, 1702c. The at least one first contact pad 1706 may be formed by processing the substrate 102 a described before.

Alternatively or additionally, the semiconductor device 1700a may include at least one second contact pad 1708 (e.g. a source/drain contact pad 1706) formed in electrical contact 1710 to the at least one semiconductor circuit element 1702a, 1702b, 1702c. The at least one second contact pad 1708 may optionally include a gate contact pad, e.g. which may be formed electrically insulated from the semiconductor region 182.

According to various embodiments, the semiconductor circuit element 1702 may include or be formed from insulated-gate bipolar transistor.

Optionally, at least one of the at least one first contact pad 1706 or the at least one second contact pad 1708 may include the at least one topography feature 102t. Alternatively or additionally, at least one of the at least one first contact pad 1706 or the at least one second contact pad 1708 may include the at least one topography feature 102t may include or be formed from the porous structure 702.

Figure 24A:
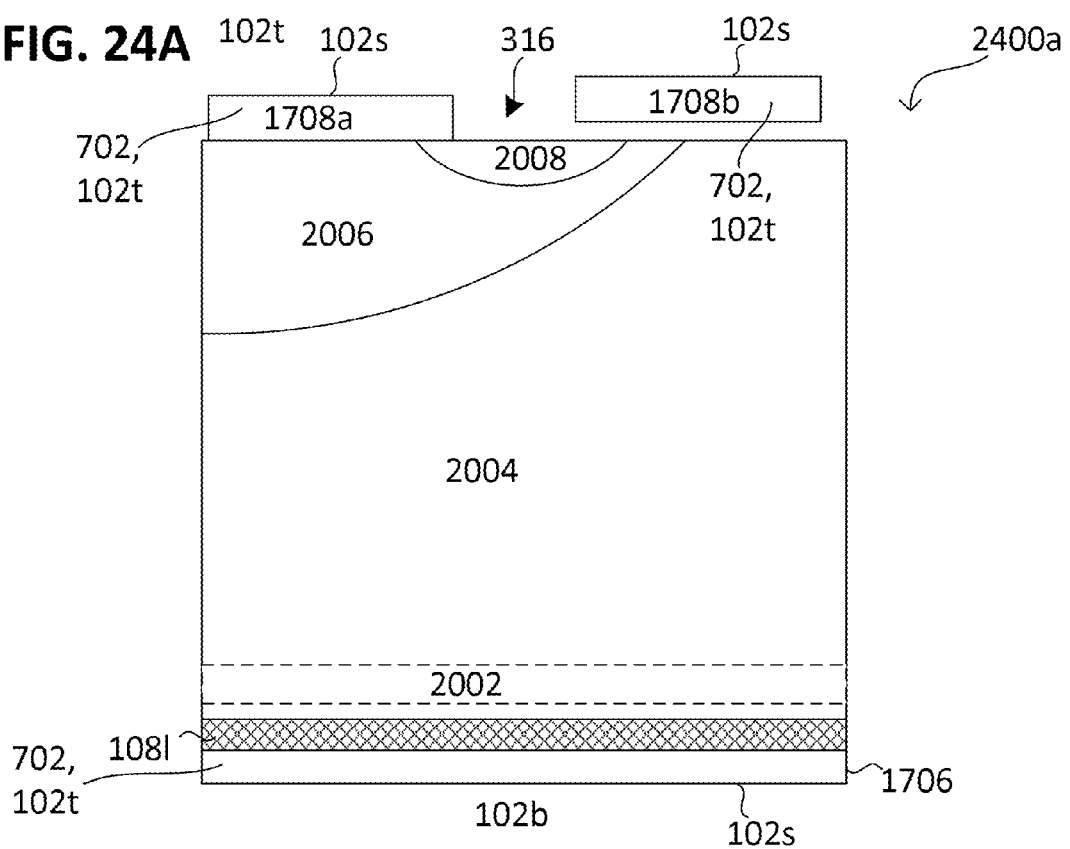
FIG. 24A and FIG. 24B respectively show a semiconductor device according to various embodiments in a method according to various embodiments in a schematic cross sectional view or side view.

FIG. 24A illustrates a semiconductor device 2400a according to various embodiments in a method according to various embodiments in a schematic cross sectional view or side view, e.g. a semiconductor circuit element 1702a, 1702b, 1702c, e.g. a power semiconductor circuit element 1702.

The semiconductor device 2400a may include the dopant layer 108l formed on a second side 102b of the substrate. The dopant layer 108l (in other words, the activated dopant) may include or be formed from a first doping type. The dopant layer 108l may include or be formed from a collector region (a doped region in form of a collector region).

The semiconductor device 2400a may further include a first contact pad 1706 first contact pad 1706 in form of a collector contact pad 1706 (e.g. a drain contact pad). The first contact pad 1706 may electrical contact the dopant layer 108l. The first contact pad 1706 may include or be formed from a metallization layer. The first contact pad 1706 may cover more than half of the dopant layer 108l, e.g. cover the dopant layer 108l substantially (e.g. more than 80% of the dopant layer 108l). The first contact pad 1706 may include or be formed from an opaque layer.

Further, the semiconductor device 2400a may include a first doped region 2006. The first doped region 2006 may include or be formed from a base region. The first doped region 2006 may include (e.g. a dopant having) a doping type equal to the dopant layer 108l (in other words, the dopant of the dopant layer 108l), e.g. the first doping type. The semiconductor device 2400a may further include a second contact pad 1708a electrical contacting the first doped region 2006. The second contact pad 1708a may include or be formed from an emitter contact pad 1708a (e.g. a source contact pad 1708a). The second contact pad 1708a may include or be formed from a metallization layer.

Further, the semiconductor device 2400a may include a second doped region 2004 formed between the first doped region 2006 and the dopant layer 108l. The second doped region 2004 may include or be formed from a drift region. The second doped region 2004 may include a doping type (second doping type) different from the dopant layer 108l, e.g. a dopant having the second doping type. The second doped region 2004 may include an epitaxial formed layer.

The semiconductor device 2400a may further include a further second contact pad 1708b. The further second contact pad 1708b may include or be formed from a gate contact pad 1708b. The further second contact pad 1708b may be formed electrical insulated from the second doped region 2004, e.g. by an electrically insulating layer formed between the further second contact pad 1708b and the second doped region 2004. The further second contact pad 1708b may include or be formed from a metallization layer.

Further, the semiconductor device 2400a may include a third doped region 2008. The third doped region 2008 may include or be formed from an emitter region. The third doped region 2008 may include (e.g. a dopant having) a doping type different from the dopant layer 108l, e.g. the second doping type. A dopant concentration of the third doped region 2008 may be greater than of the second doped region 2004.

Optionally, the semiconductor device 2400a may include a fourth doped region 2002 between the second doped region 2004 and the dopant layer 108l. The fourth doped region 2002 may include or be formed from a field stop region. The fourth doped region 2002 may include a dopant having a doping type different from the dopant layer 108l. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

The semiconductor device 2400a, e.g. a semiconductor circuit element 1702 may include or be formed from a transistor structure, e.g. a planar transistor structure (providing a vertical current flow). A transistor structure may include or be formed from a plurality of p-n junctions. A p-n junction may be formed by an interface of two doped regions having different doping types, e.g. an interface between at least one the following: the first doped region 2006 and the second doped region 2004; the first doped region 2006 and the third doped region 2008; the second doped region 2004 and the dopant layer 108l; the second doped region 2004 and the fourth doped region 2002 (if present).

According to various embodiments, the semiconductor device 2400a, e.g. a semiconductor circuit element 1702, may include or be formed from insulated-gate bipolar transistor.

Figure 24B:
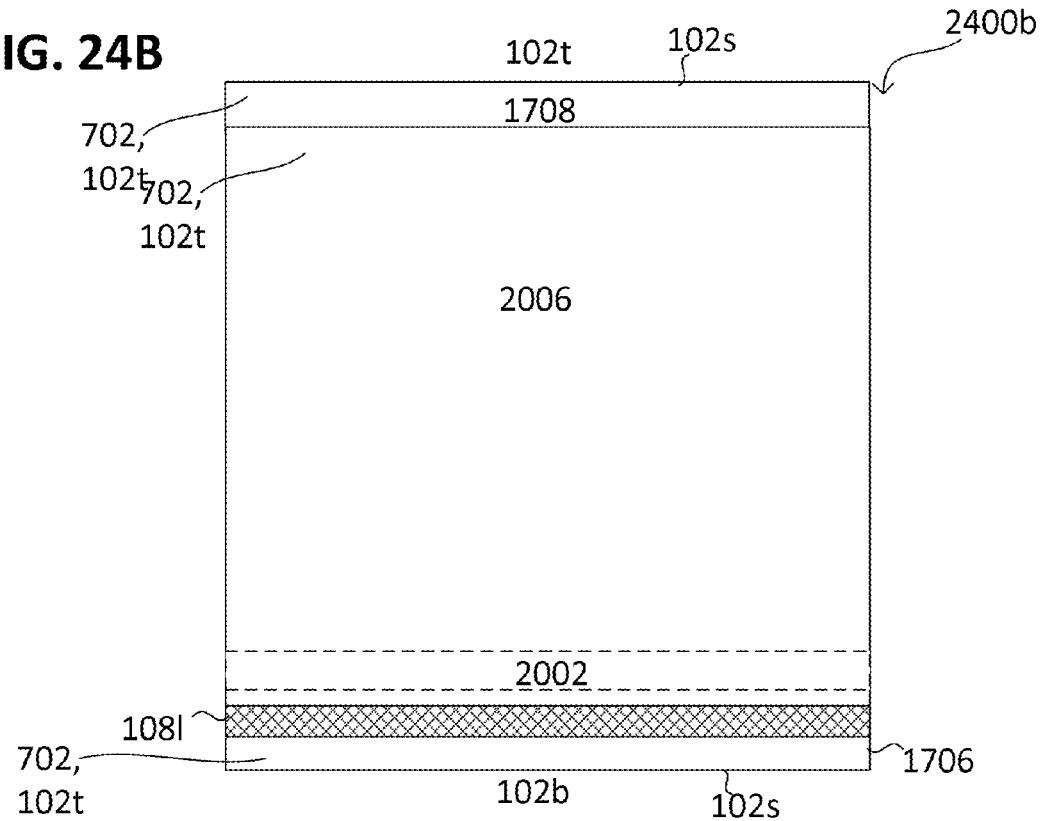

FIG. 24B illustrates a semiconductor device 2400b according to various embodiments in a method according to various embodiments in a schematic cross sectional view or side view, e.g. a semiconductor circuit element 1702a, 1702b, 1702c.

The semiconductor device 2400b may include the dopant layer 108l formed on the second side 102b. The dopant layer 108l (in other words, the activated dopant) may include or be formed from a first doping type. The dopant layer 108l may include or be formed from a first junction region.

The semiconductor device 2400b may further include a first contact pad 1706 electrical contacting the dopant layer 108l. The first contact pad 1706 may include or be formed from an electrode contact pad. The first contact pad 1706 may include or be formed from a metallization layer. The first contact pad 1706 may substantially cover the dopant layer 108l.

Further, the semiconductor device 2400b may include a first doped region 2006. The first doped region 2006 may include or be formed from a second junction region. The first doped region 2006 may include a dopant having a doping type different from the dopant layer 108l (in other words, the dopant of the dopant layer 108l), e.g. the second doping type. The semiconductor device 2000a may further include a second contact pad 1708 electrical contacting the first doped region 2006. The second contact pad 1708 may include or be formed from an electrode contact pad. The second contact pad 1708a may include or be formed from a metallization layer.

Optionally, the semiconductor device 2000a may include a second doped region 2002 between the first doped region 2006 and the dopant layer 108l. The second doped region 2002 may include or be formed from a field stop region. The second doped region 2002 may include (e.g. a dopant having) a doping type equal to the dopant layer 108l. The second doped region 2002 may include a dopant concentration higher than the first doped region 2006.

The semiconductor device 2400*b*, e.g. a semiconductor circuit element 1702*b*, 1702*b*, 1702*b*, e.g. a power semiconductor circuit element may include or be formed from a diode structure, e.g. a planar diode structure (providing a vertical current flow). A diode structure may include or be formed from a p-n junction, e.g. formed by an interface of two doped regions having different doping types, e.g. an interface between the first doped region 2006 and the dopant layer 108*l* or an interface between the second doped region 2002 (if present) and the first doped region 2006.

Optionally, the dopant layer 108*l* may include or be formed from a plurality of first segments including the first doping type and a plurality of second segments including the second doping type. The segments of the plurality of first segments and the segments of the plurality of second segments may be disposed in an alternating order. In this case, the dopant layer 108*l* may be part of backward-diode structure.

Further, various embodiments will be described in the following.

According to various embodiments, a method may include: disposing a viscous material (in other words, a base material formed from a viscous state) over at least one concave topography feature of at least one of a substrate or a surface to form a protection layer over at least one of the substrate or the surface; adjusting a viscosity of the base material during disposing the base material such that the base material is substantially not flowing into the at least one concave topography feature; processing at least one of the substrate or the surface using the protection layer as mask; and removing the protection layer after processing at least one of the substrate or the surface.

According to various embodiments, a method may include: providing a at least one of the substrate or the surface including at least one (e.g. concave) topography feature having a height variation (e.g. a deviation from a surface mean plane) of at least 1 μm (e.g. at least 2 μm, at least 5 μm, at least 10 μm); and forming a protection layer from a viscous material (in other words, a base material formed from a viscous state) over the at least one concave topography feature; wherein the protection layer partially bridges the at least one concave topography feature such that a height variation of a side of the protection layer facing the at least one topography feature is smaller than the height variation of the at least one topography feature.

According to various embodiments, a method may include: disposing a viscous material (in other words, a base material formed from a viscous state) over a topography feature extending into at least one of a substrate or a surface to form a protection layer over at least one of the substrate or the surface; adjusting a viscosity of the base material during the base material contacts the at least one uneven surface portion such that a position of the base material relative to the at least one uneven surface portion is substantially maintained; processing at least one of the substrate or the surface using the protection layer as mask; and removing the protection layer after processing at least one of the substrate or the surface.

According to various embodiments, a method may include: disposing a viscous material (in other words, a base material formed from a viscous state) over at least one of a substrate or a surface according to a predetermined spatial material distribution to form a protection layer over at least one of the substrate or the surface; adjusting a viscosity of the base material during disposing the base material such that a spatial material distribution of the base material is substantially maintained; processing at least one of the substrate or the surface using the protection layer as mask; and removing the protection layer after processing at least one of the substrate or the surface.

According to various embodiments, adjusting the viscosity may be configured to substantially maintain a spatial distribution of the base material (e.g. including or formed from the viscous state) with which the base material contacts at least one of the substrate or the surface.

According to various embodiments, at least one of the substrate or the surface may include at least one concave topography feature having a height variation (e.g. a deviation from a surface mean plane) of greater than about 1 μm, e.g. greater than about 2 μm, e.g. greater than about 3 μm, e.g. greater than about 4 μm, e.g. greater than about 5 μm, e.g. greater than about 6 μm, e.g. greater than about 7 μm, e.g. greater than about 8 μm, e.g. greater than about 9 μm, e.g. greater than about 10 μm, e.g. greater than about 20 μm, e.g. greater than about 50 μm; and/or of less than about 500 μm, e.g. less than about 200 μm, e.g. of less than about 100 μm, e.g. less than about 50 μm, e.g. less than about 20 μm.

According to various embodiments, the protection layer may cover the at least one topography feature non-conformal.

According to various embodiments, a method may include: disposing a viscous material (in other words, a base material formed from a viscous state) over at least one of a substrate or a surface to form a protection layer over at least one of the substrate or the surface; adjusting a viscosity of the base material (e.g. including or formed from the viscous state) during a contacting period of the base material and at least one of the substrate or the surface to stabilize a spatial distribution of the base material as disposed; processing at least one of the substrate or the surface using the protection layer as mask; and removing the protection layer after processing at least one of the substrate or the surface.

According to various embodiments, a method may include: disposing a viscous material over at least one of a substrate or a surface to form a protection layer over at least one of the substrate or the surface; adjusting a viscosity of the viscous material during a contacting period of the viscous material and at least one of the substrate or the surface to stabilize a spatial distribution of the viscous material as disposed; processing at least one of the substrate or the surface using the protection layer as mask; and removing the protection layer after processing at least one of the substrate or the surface.

According to various embodiments, a method may include: disposing a viscous material (in other words, a base material formed from a viscous state) over at least one of a substrate or a surface to form a protection layer over at least one of the substrate or the surface; adjusting a viscosity of the base material (e.g. including or formed from the viscous state) during a substrate contact induced deformation (contact with the substrate) of the base material (e.g. including or formed from the viscous state) and at least one of the substrate or the surface to stabilize a spatial distribution of the base material (e.g. including or formed from the viscous state) as contacting the substrate; processing at least one of the substrate or the surface using the protection layer as mask; and removing the protection layer after processing at least one of the substrate or the surface.

According to various embodiments, adjusting the viscosity of the base material (e.g. including or formed from the viscous state) may include or be formed from transforming the base material (e.g. including or formed from the viscous state) into a non-viscous state after the base material (e.g. including or formed from the viscous state) contacts at least one of the substrate or the surface, e.g. at least partially before all base material (e.g. including or formed from the viscous state) is disposed.

According to various embodiments, the base material (e.g. including or formed from the viscous state) may be disposed over at least one of the substrate or the surface by a sequential deposition process.

According to various embodiments, adjusting the viscosity of the base material (e.g. including or formed from the viscous state) may include or be formed from transforming the base material into a non-viscous state before the base material is displaced from a position in which the base material contacts at least one of the substrate or the surface.

According to various embodiments, adjusting the viscosity of the base material (e.g. including or formed from the viscous state) may include or be formed from at least one of curing or solidify the base material (e.g. including or formed from the viscous state) before the base material is displaced from a position in which the base material contacts at least one of the substrate or the surface.

According to various embodiments, adjusting the viscosity of the base material (e.g. including or formed from the viscous state) may be configured to form at least one hollow between the protection layer and at least one of the substrate or the surface.

According to various embodiments, adjusting the viscosity of the base material (e.g. including or formed from the viscous state) may be configured to form at least one hollow between the protection layer and at least one of the substrate or the surface if the at least one topography feature includes or is formed from a macroscopic topography feature.

According to various embodiments, the viscosity of the base material (e.g. including or formed from the viscous state) may be adjusted by changing at least one of: a temperature of the base material; a chemical structure of the base material.

According to various embodiments, the base material (e.g. including or formed from the viscous state) may include or be formed from a photoactive material; wherein the viscosity of the base material is adjusted by exposing the base material to light having a developer wavelength of the photoactive material.

According to various embodiments, a temperature of the base material (e.g. including or formed from the viscous state) before contacting at least one of the substrate or the surface is greater than a solidification temperature of the base material.

According to various embodiments, the viscosity of the base material (e.g. including or formed from the viscous state) is adjusted by cooling the base material.

According to various embodiments, at least one of the substrate or the surface may include a temperature less than a solidification temperature of the base material (e.g. including or formed from the viscous state) for cooling the base material.

According to various embodiments, the base material (e.g. including or formed from the viscous state) may include or be formed from a thermoplastic material.

According to various embodiments, the base material (e.g. including or formed from the viscous state) may include or be formed from a hot-melt material.

According to various embodiments, the method may further include: adjusting a thickness of the protection layer by at least one of: adjusting a temperature difference between the base material (e.g. including or formed from the viscous state) and at least one of the substrate or the surface before the base material contacts at least one of the substrate or the surface; adjusting a temperature of at least one of the substrate or the surface; adjusting a temperature of the base material (e.g. including or formed from the viscous state); adjusting an amount of the base material (e.g. including or formed from the viscous state) being disposed sequentially; adjusting an intensity of light having a developer wavelength to which the base material (e.g. including or formed from the viscous state) is exposed; adjusting a wavelength of light to which the base material (e.g. including or formed from the viscous state) is exposed; or disposing additional viscous material (in other words, a base material formed from a viscous state) over the base material (e.g. including or formed from at least one of: the viscous state or the non-viscous state) which spatial distribution is stabilized.

According to various embodiments, the base material (e.g. including or formed from at least one of: the viscous state or the non-viscous state) may be free of a volatile solvent.

According to various embodiments, at least one of the substrate or the surface may include or be formed from a surface portion having a surface normal which is tilted regarding a gravitational force direction, wherein a position of the base material (e.g. including or formed from at least one of: the viscous state or the non-viscous state) in which the base material (e.g. including or formed from the viscous state) contacts the surface portion is maintained by adjusting the viscosity of the base material.

According to various embodiments, the base material (e.g. including or formed from the viscous state) may be disposed using a (e.g. thermal) drop-on-demand process.

According to various embodiments, the base material (e.g. including or formed from the viscous state) may be disposed using a printing process.

According to various embodiments, at least one of the substrate or the surface may include at least one topography feature extending into at least one of the substrate or the surface, wherein at least one of the protection layer or the base material (e.g. including or formed from at least one of: the viscous state or the non-viscous state) covers the at least one topography feature.

According to various embodiments, a thickness of at least one of the protection layer or the base material (e.g. including or formed from at least one of: the viscous state or the non-viscous state) may be less than an extension of the at least one topography feature into at least one of the substrate or the surface.

According to various embodiments, a volume of at least one of the protection layer or the base material (e.g. including or formed from at least one of: the viscous state or the non-viscous state) may be less than a volume of the at least one topography feature.

According to various embodiments, the at least one topography feature may include or be formed from a concave surface.

According to various embodiments, the viscosity of the base material (e.g. including or formed from the viscous state) may be adjusted such that at least one of the protection layer or the base material (e.g. including or formed from at least one of: the viscous state or the non-viscous state) is substantially not flowing into the topography feature, if the at least one topography feature includes or is formed from a microscopic opening.

According to various embodiments, the viscosity of the base material (e.g. including or formed from the viscous state) is adjusted such that at least one of the protection layer or the base material (e.g. including or formed from at least one of: the viscous state or the non-viscous state) is substantially not flowing into the topography feature, if a lateral extension of the at least one topography feature is smaller than the thickness of the protection layer.

According to various embodiments, the viscosity of the base material (e.g. including or formed from the viscous state) is adjusted such that at least one of the protection layer or the base material (e.g. including or formed from at least one of: the viscous state or the non-viscous state) is substantially lining the topography feature, if the at least one topography feature includes or is formed from a macroscopic opening According to various embodiments, the viscosity of the base material (e.g. including or formed from the viscous state) may be adjusted such that at least one of the protection layer or the base material (e.g. including or formed from at least one of: the viscous state or the non-viscous state) is substantially lining the topography feature, if a lateral extension of the at least one topography feature is greater than the thickness of the protection layer.

According to various embodiments, adjusting the viscosity of the base material (e.g. including or formed from the viscous state) may include or be formed from transforming the base material into a non-viscous state after the base material contacts at least one of the substrate or the surface and before at least one of the protection layer or the base material (e.g. including or formed from at least one of: the viscous state or the non-viscous state) flows into the at least one concave topography feature.

According to various embodiments, adjusting the viscosity of the base material (e.g. including or formed from the viscous state) may include or be formed from at least one of curing or solidify the base material after the base material contacts at least one of the substrate or the surface and before at least one of the protection layer or the base material (e.g. including or formed from at least one of: the viscous state or the non-viscous state) flows into the at least one concave topography feature.

According to various embodiments, adjusting the viscosity of the base material (e.g. including or formed from the viscous state) is configured to form a hollow in the at least one concave topography feature covered by at least one of the protection layer or the base material (e.g. including or formed from at least one of: the viscous state or the non-viscous state).

According to various embodiments, a method may include: at least partially filling at least one topography feature extending into at least one of a substrate or a surface with a sacrificial material; disposing a viscous material (in other words, a base material formed from a viscous state) over the sacrificial material to form a protection layer over the at least one topography feature; processing at least one of the substrate or the surface using the protection layer as mask; and removing the protection layer and the sacrificial material after processing at least one of the substrate or the surface.

According to various embodiments, a solubility of the sacrificial material in a solvent may be greater than a solubility of at least one of the protection layer or the base material (e.g. including or formed from at least one of: the viscous state or the non-viscous state) in the solvent.

According to various embodiments, the solvent may be non-organic.

According to various embodiments, the sacrificial material may be removed using the solvent and at least one of the protection layer or the base material (e.g. including or formed from at least one of: the viscous state or the non-viscous state) may be removed using a solvent different from the solvent.

According to various embodiments, the solvent may include or be formed from a protic material, e.g. a protic liquid.

According to various embodiments, the solvent may be protic.

According to various embodiments, the solvent may include or be formed from a non organic material.

According to various embodiments, the solvent may be non-organic.

According to various embodiments, the solvent may include or be formed from a water based fluid.

According to various embodiments, the solvent may include or be formed from water.

According to various embodiments, the at least one (e.g. concave) topography feature may include or be formed from at least one of the following topography features: a pore, an opening, a step, a recess, a trench; a macroscopic deviation from a planar plane.

According to various embodiments, the at least one of the protection layer or the base material (e.g. including or formed from at least one of: the viscous state or the non-viscous state) may be disposed on at least one of the substrate or the surface in accordance with a predetermined pattern.

According to various embodiments, a method may further include: structuring the protection layer using photolithography before processing at least one of the substrate or the surface.

According to various embodiments, at least one of the substrate or the surface may include or be formed from at least one of: a metal, a semiconductor.

According to various embodiments, at least one of the substrate or the surface (e.g. of the substrate) contacted by at least one of the protection layer or the base material (e.g. including or formed from at least one of: the viscous state or the non-viscous state) may include or be formed from at least one of: a metal, a semiconductor.

According to various embodiments, at least one of the substrate or the surface may include or be formed from copper.

According to various embodiments, at least one of the substrate or the surface contacted by at least one of the protection layer or the base material (e.g. including or formed from at least one of: the viscous state or the non-viscous state) may include or be formed from copper.

According to various embodiments, processing may include or be formed from wet etching or dry etching at least one of the substrate or the surface in regions which are exposed from at least one of the protection layer or the base material (e.g. including or formed from at least one of: the viscous state or the non-viscous state).

According to various embodiments, at least one of the substrate or the surface may include or be formed from a plurality of pores which are opened at a surface contacted by the base material (e.g. including or formed from the viscous state).

According to various embodiments, at least one of the protection layer or the base material (e.g. including or formed from at least one of: the viscous state or the non-viscous state) may be removed using a solvent having a greater temperature than the protection layer.

According to various embodiments, removing at least one of the protection layer or the base material (e.g. including or formed from at least one of: the viscous state or the non-viscous state) may include or be formed from heating at least one of the protection layer or the base material (e.g. including or formed from at least one of: the viscous state or the non-viscous state).

According to various embodiments, adjusting the viscosity of the viscous material may include or be formed from transforming the viscous material into a non-viscous state at least one of during a contacting period or after the viscous material contacts the substrate.

According to various embodiments, adjusting the viscosity of the viscous material may include or be formed from transforming the viscous material into a non-viscous state before the viscous material is displaced from a position in which the viscous material contacts the substrate.

According to various embodiments, a contact pad may be formed by structuring at least one of the substrate or the surface.

According to various embodiments, the contact pad may include or be formed from a thick power metallization.

According to various embodiments, the method may further include forming a porous copper layer to provides the surface.

According to various embodiments, the porous copper layer may be formed by printing a copper paste using at least one of: stencil printing, screen printing, plasma enhanced deposition of copper micro particles (also referred to as plasma-dust), or electrochemical deposition of copper with special electrolyte additives.

According to various embodiments, in case of plasma-dust, the structuring may include using a chemical wet etching process.

According to various embodiments, the method may further include forming a barrier layer underlying the surface.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
    at least partially filling at least one topography feature extending into a substrate with a sacrificial material;
    disposing a viscous material over the sacrificial material to form a protection layer over the at least one topography feature;
    processing the substrate using the protection layer as mask; and
    removing the protection layer and the sacrificial material after processing the substrate.

2. The method of claim 1, wherein the protection layer is removed using a first solvent.

3. The method of claim 2, wherein the first solvent is heated.

4. The method of claim 2, wherein the first solvent is an alkaline fluid or an organic fluid.

5. The method of claim 1, wherein the first solvent comprises a temperature greater than a temperature of the protection layer.

6. The method of claim 2, wherein the sacrificial layer is removed using a second solvent, wherein the second solvent is different from the first solvent.

7. The method of claim 6,
    wherein a solubility of the sacrificial material in the second solvent is greater than a solubility of the viscous material in the second solvent.

8. The method of claim 6,
    wherein the solvent comprises a non-organic material.

9. The method of claim 6, wherein the protection layer is removed using the first solvent before the sacrificial layer is removed using the second solvent.

10. The method of claim 6, wherein the first and second solvents are mixed and the protection layer and the sacrificial layer are removed together.

11. The method of claim 1,
    wherein the at least one topography feature comprises at least one of the following topography features: a pore, an opening, a step, a recess, a trench; a macroscopic deviation from a planar plane.

12. The method of claim 1, further comprising:
    structuring the protection layer using photolithography before processing the substrate.

13. The method of claim 1, wherein the substrate comprising a porous layer.

14. The method of claim 13, wherein the porous layer is a porous metal layer.

15. The method of claim 14, wherein the porous metal layer is a porous copper layer.

16. The method of claim 1, wherein processing the substrate comprises etching the substrate.

17. The method of claim 16, wherein etching the substrate comprises a wet etching or a dry etching process.

* * * * *